United States Patent
Tamaoki

(10) Patent No.: US 9,996,639 B2
(45) Date of Patent: Jun. 12, 2018

(54) TOPOGRAPHY SIMULATION APPARATUS, TOPOGRAPHY SIMULATION METHOD AND RECORDING MEDIUM

(71) Applicant: Toshiba Memory Corporation, Minato-ku, Tokyo (JP)

(72) Inventor: Naoki Tamaoki, Ota Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 594 days.

(21) Appl. No.: 14/657,820

(22) Filed: Mar. 13, 2015

(65) Prior Publication Data

US 2016/0070823 A1    Mar. 10, 2016

Related U.S. Application Data

(60) Provisional application No. 62/048,158, filed on Sep. 9, 2014.

(51) Int. Cl.
*G06F 17/50* (2006.01)

(52) U.S. Cl.
CPC .............. *G06F 17/5009* (2013.01)

(58) Field of Classification Search
None
See application file for complete search history.

(56) References Cited

U.S. PATENT DOCUMENTS 7,955,876 B2    6/2011    Kinoshita

FOREIGN PATENT DOCUMENTS

| JP | 06196405 A | | 7/1994 |
| JP | 2001176869 A | * | 6/2001 |
| JP | 2005034843 A | | 2/2005 |
| JP | 2006206943 A | * | 8/2006 |

OTHER PUBLICATIONS

Tao, Jing et al. ("Test Structure for Electrical Characterization of Copper Nanowire Anisotropic Conductive Film (NW-ACF) for 3D Stacking Applications"), Mar. 24-27, 2014, IEEE Conference on Microelectronic Test Structures, IEEE. (Year: 2014).*

* cited by examiner

*Primary Examiner* — Cedric Johnson
(74) *Attorney, Agent, or Firm* — Holtz, Holtz & Volek PC

(57) ABSTRACT

In one embodiment, a topography simulation apparatus includes a division module to divide a calculating area for calculating topography of a substance into cells and express the topography using filled cells and vacant cells, and a calculation module to calculate a filling rate for a target cell based on processing rates for its neighboring cells. The calculation module calculates, based on the processing rates for the neighboring cells, contributing rates of the neighboring cells contributing to the filling rate for the target cell. The calculation module calculates, based on the contributing rates of the neighboring cells, the filling rate for the target cell. One of the contributing rates of the neighboring cells of the target cell depends on whether another neighboring cell of the target cell is a first cell whose filling ratio belongs to first range or a second cell whose filling ratio belongs to second range.

20 Claims, 17 Drawing Sheets

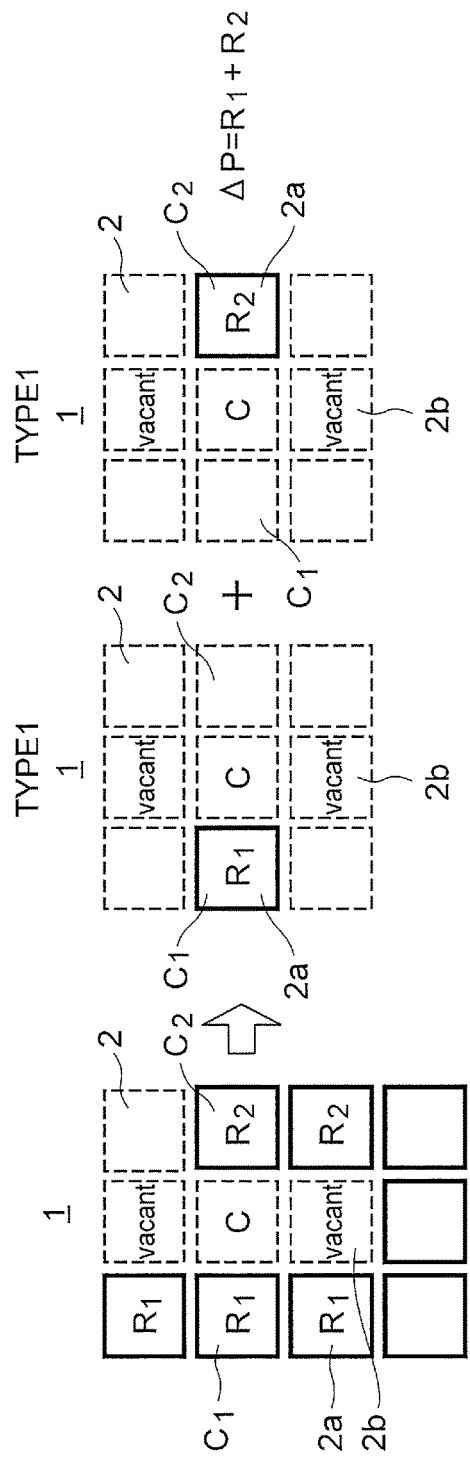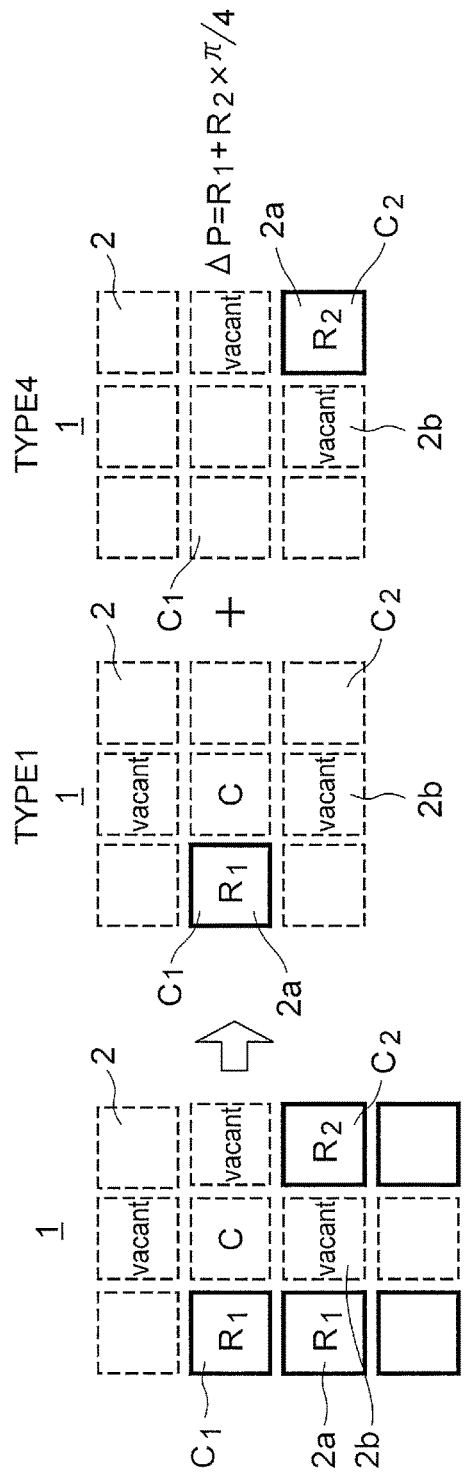
FIG.7A
FIG.7B $$\Delta P = \max [R_{t1}+R_{t2}, R_{t3}+R_{t4}, R_{t5}+R_{t6}]$$

- $C_{n1}$ IS FILLED CELL
  → $R_{t1} = R_{n1}$
- $C_{n1}$ IS VACANT CELL
  → TAKE $R_{s1} - R_{s4}$ AND $R_{c1} - R_{c4}$ INTO ACCOUNT

- C, $C_{n1}$ AND $C_{n2}$ ARE VACANT CELLS
  → $R_{s1}' = R_{s1} \times \pi/4$
- OTHERS
  → $R_{s1}' = 0$

- C, Cn1, Cn2, Cn3, Cs1, Cs3 AND Cs5 ARE VACANT CELLS
  → $R_{c1}' = R_{c1} \times \pi/6$
- OTHERS
  → $R_{c1}' = 0$

- $C_{n1}$ IS FILLED CELL
  → $R_{t1} = R_{n1}$
- $C_{n1}$ IS VACANT CELL
  → $R_{t1} = \max[(R_{s1}'+R_{s2}'), (R_{s3}'+R_{s4}')]$
  $+ (R_{c1}'+R_{c2}'+R_{c3}'+R_{c4}')$ $\Delta P = \max[R_{t1}+R_{t2}, R_{t3}+R_{t4}, R_{t5}+R_{t6}]$

US 9,996,639 B2

TOPOGRAPHY SIMULATION APPARATUS, TOPOGRAPHY SIMULATION METHOD AND RECORDING MEDIUM

CROSS REFERENCE TO RELATED APPLICATION

This application is based upon and claims the benefit of priority from the prior U.S. Provisional Patent Application No. 62/048,158 filed on Sep. 9, 2014, the entire contents of which are incorporated herein by reference.

FIELD

Embodiments described herein relate to a topography simulation apparatus, a topography simulation method and a recording medium.

BACKGROUND

When a substance is processed by chemical vapor deposition (CVD), reactive ion etching (RIE) or the like, a topography simulation is often pre-performed to calculate changes in topography of the substance associated with the processing. In the topography simulation, the changes in topography of the substance is calculated, for example, by dividing a calculating area for calculating the topography of the substance into a plurality of cells, expressing the topography of the substance using filled cells which are filled with a predetermined amount of the substance and vacant cells which are not filled with the predetermined amount of the substance, and calculating changes in distribution of the filled cells and the vacant cells (this method is referred to as "cell method"). However, the cell method is generally requested not only to improve calculation accuracy but also to reduce calculation time, so that the improvement of the calculation accuracy based on a reduction in cell size and time step is limited in the cell method. Consequently, when the topography of the substance is expressed using the filled cells and the vacant cells, there is a possibility that the changes in topography of the substance cannot be accurately calculated depending on the topography of the substance. Therefore, simulation results obtained by the topography simulation may be inconsistent with the changes in topography of the substance in actual semiconductor fabrication steps.

BRIEF DESCRIPTION OF THE DRAWINGS

FIGS. 7A and 7B are diagrams illustrating irregular types of the neighboring cells of each target cell in the topography simulation method of the first embodiment;

DETAILED DESCRIPTION

Embodiments will now be explained with reference to the accompanying drawings.

In one embodiment, a topography simulation apparatus includes a division module configured to divide a calculating area for calculating topography of a substance into a plurality of cells, and to express the topography of the substance using filled cells which are filled with a predetermined amount of the substance and vacant cells which are not filled with the predetermined amount of the substance. The apparatus further includes a calculation module configured to calculate a filling rate for a target cell in the calculating area, based on processing rates for neighboring cells which neighbor to the target cell. The calculation module includes a contributing rate calculation module configured to calculate, based on the processing rates for the neighboring cells, contributing rates of the neighboring cells contributing to the filling rate for the target cell. The calculation module further includes a filling rate calculation module configured to calculate, based on the contributing rates of the neighboring cells, the filling rate for the target cell. One of the contributing rates of the neighboring cells of the target cell depends on whether another neighboring cell of the target cell is a first cell whose filling ratio of the substance belongs to a first range or a second cell whose filling ratio of the substance belongs to a second range different from the first range.

First Embodiment

Figure 1A:
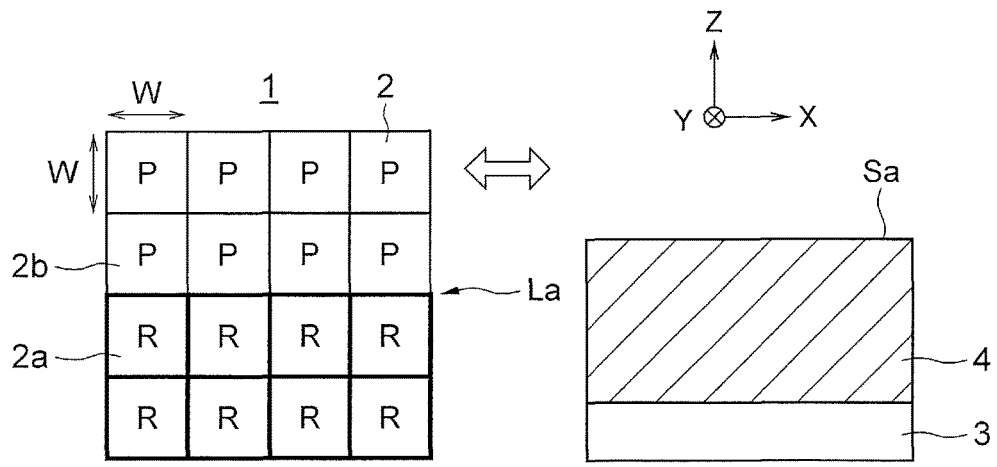
FIGS. 1A to 1C are diagrams illustrating a calculating area for a topography simulation method of a first embodiment.
Figure 1B:
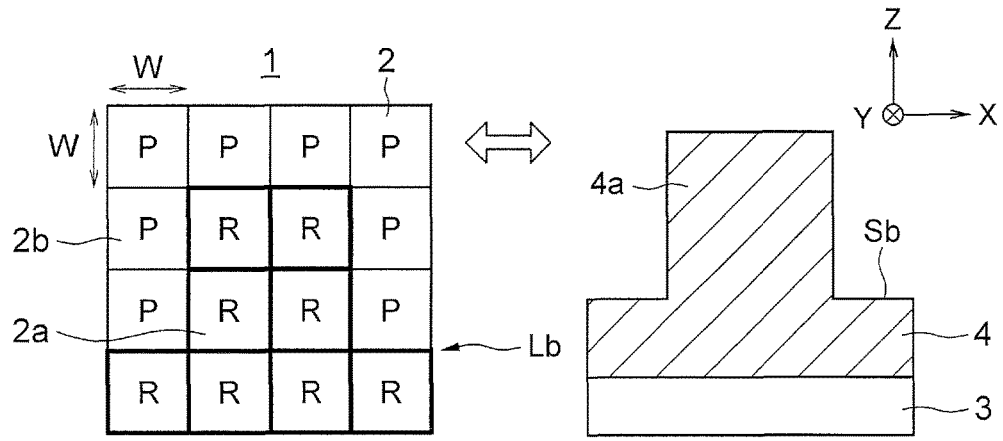
Figure 1C:
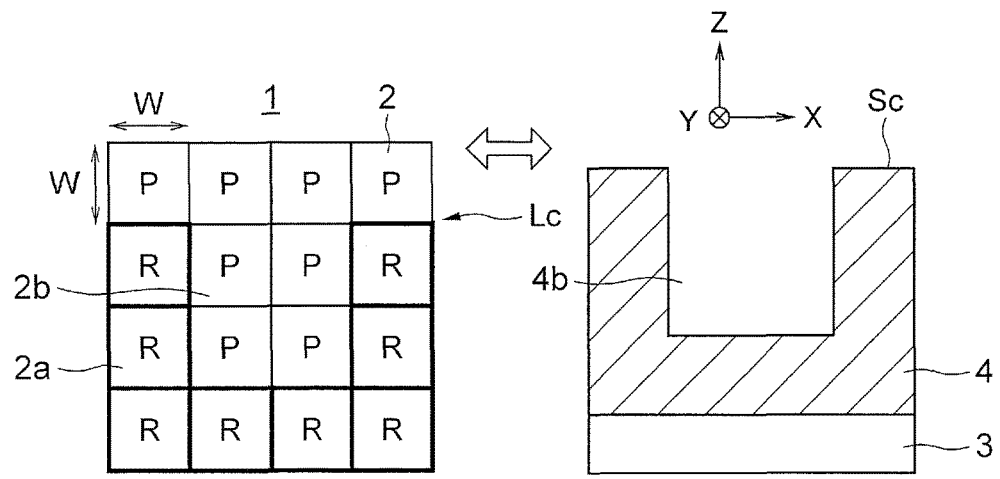

FIGS. 1A to 1C are diagrams illustrating a calculating area for a topography simulation method of a first embodiment. The topography simulation method of the present embodiment is executed by an information processing apparatus such as a personal computer or a workstation.

In the present embodiment, a calculating area 1 for the topography of a substance is divided into a plurality of cells 2, and the topography of the substance is expressed using filled cells 2a which are filled with a predetermined amount of the substance and vacant cells 2b which are not filled with the predetermined amount of the substance, as illustrated in FIG. 1A. Then, in the present embodiment, changes in topography of the substance are calculated by calculating changes in the distribution of the filled cells 2a and the vacant cells 2b. As described above, the topography simulation method of the present embodiment is executed by the cell method.

The calculating area 1 of the present embodiment is a two-dimensional area. The calculating area 1 of the present embodiment is used to simulate processing of a structure with a band-like planar shape such as an element area, an isolation area, a gate conductor, a word line, or a bit line.

The shape of each cell 2 of the present embodiment is a square. The length and width of each cell 2 is denoted by reference character W. The shape of each cell 2 may be other than the square.

FIG. 1A illustrates 16 (4×4) cells 2. The cells correspond to some of the cells 2 in the calculating area 1. The number of the cells in the calculating area 1 can be optionally set with the calculation accuracy and time for the topography simulation taken into account.

The topography simulation method of the present embodiment allows simulation of various types of processing of the substance such as deposition and etching. A case will be described below where the topography simulation method of the present embodiment is applied to a deposition process.

Each filled cell 2a has a deposition rate "R" as a variable. The deposition rate "R" represents the amount of the substance newly deposited on a unit surface of an existing substance area per unit time. The deposition rate "R" of the present embodiment is set to the amount of the substance deposited on each filled cell 2a per topography simulation time step "Δt". As described below, the rate at which each cell 2 is filled with the substance (filling rate) depends on the deposition rate "R" of a neighboring cell 2 neighboring to each cell 2.

The deposition rate "R" of the present embodiment is an example of a processing rate. When the topography simulation method of the present embodiment is applied to an etching process, an etching rate is used as the processing rate instead of the deposition rate "R". In the present embodiment, the deposition rate "R" is set to a positive value, and the etching rate is set to a negative value. The topography simulation method of the present embodiment can be applied to a process in which deposition and etching progress at the same time, by using the sum of the deposition rate "R" and the etching rate as the processing rate.

Each vacant cell 2b has a filling ratio "P" for the substance in each vacant cell 2b as a variable. The filling ratio "P" is indicative of the rate of the volume of the substance in the volume of each vacant cell 2b. The filling ratio "P" for each vacant cell 2b of the present embodiment may take a value of at least 0 and less than 1 (0≤"P"<1). The vacant cell 2b with a filling ratio "P" of 0 contains no substance. Furthermore, for the vacant cell 2b with a filling ratio "P" of 0.5, half of the volume is occupied by the substance.

When the substance in the vacant cell 2b is increased by the deposition process, the filling ratio "P" for the vacant cell 2b increases. Then, when the filling ratio "P" for the vacant cell 2b reaches 1, the vacant cell 2b changes to the filled cell 2a. In this manner, the filled cell 2a is the cell 2 with a filling ratio "P" of 1, and the vacant cell 2b is the cell 2 with a filling ratio of less than 1. In other words, the filled cell 2a is the cell 2 filled with the substance the amount of which corresponds to a filling ratio "P" of 1. The vacant cell 2b is the cell 2 that is not filled with the substance the amount of which corresponds to a filling ratio "P" of 1.

When the substance in the vacant cell 2b is reduced by the etching process, the filling ratio "P" for the vacant cell 2b decreases. Furthermore, when the substance in the filled cell 2a is reduced by the etching process, the filled cell 2a changes to the vacant cell 2b with a filling ratio "P" of less than 1.

A threshold for the filling ratio "P" for the filled cell 2a and the vacant cell 2b may be a value of less than 1. For example, the threshold for the filling ratio "P" may be 0.5. In this case, the cell 2 with a filling ratio "P" of at least 0 and less than 0.5 is the vacant cell 2b (0≤"P"<0.5). The cell 2 with a filling ratio "P" of 0.5 is the filled cell 2a ("P"=0.5). In this case, the filled cell 2a is the cell 2 filled with the substance the amount of which corresponds to a filling ratio "P" of 0.5. The vacant cell 2b is the cell 2 that is not filled with the substance the amount of which corresponds to a filling ratio "P" of 0.5.

Furthermore, in this case, the domain of the filling ratio "P" may be limited to "0≤"P"≤0.5", or the domain of the filling ratio "P" may be limited to "0≤P≤1". In the latter case, when the filled cell 2a has the filling ratio "P" as the variable, the filled cell 2a is the cell 2 with a filling ratio "P" of at least 0.5 and at most 1 (0.5≤"P"≤1). In this case, when a certain cell 2 changes from the vacant cell 2b to the filled cell 2a after the filling ratio "P" for the cell 2 reaches 0.5, the filling ratio "P" for the cell 2 subsequently continues to increase until the filling ratio "P" reaches 1.

The calculating area 1 in the left of FIG. 1A represents a structure in the right of FIG. 1A. The structure includes a substrate 3 and a deposited film 4 formed on the substrate 3. A boundary between the filled cell 2a and the vacant cell 2b is denoted by reference character La in the left of FIG. 1A. A surface of the deposited film 4 is denoted by reference character Sa in the right of FIG. 1A. The boundary La is a straight line, indicating that the surface Sa is a flat surface.

FIG. 1B illustrates another example of the calculating area 1 of the present embodiment. A boundary Lb in FIG. 1B is a convex curve. This indicates that a surface Sb in FIG. 1B is a convex surface. A convex portion provided on the deposited film 4 is denoted by reference numeral 4a.

FIG. 1C illustrates another example of the calculating area 1 of the present embodiment. A boundary Lc in FIG. 1C is a concave curve. This indicates that a surface Sc in FIG. 1C is a concave surface. Reference numeral 4b is indicative of a concave portion formed in the deposited film 4.

FIGS. 1A to 1C illustrate an X direction and a Y direction parallel to the surface of the substrate 3 and perpendicular to each other and a Z direction perpendicular to the surface of the substrate 3. The convex portion 4a in FIG. 1B and the concave portion 4b in FIG. 1C have band-like planar shapes extending in the Y direction. In the specification, a +Z direction is treated as an upward direction, and a −Z direction is treated as a downward direction. For example, the positional relation between the substrate 3 and the deposited film 4 is represented by the substrate 3 being positioned under the deposited film 4. The −Z direction may or may not coincide with the direction of gravitational force.

Figure 2A:
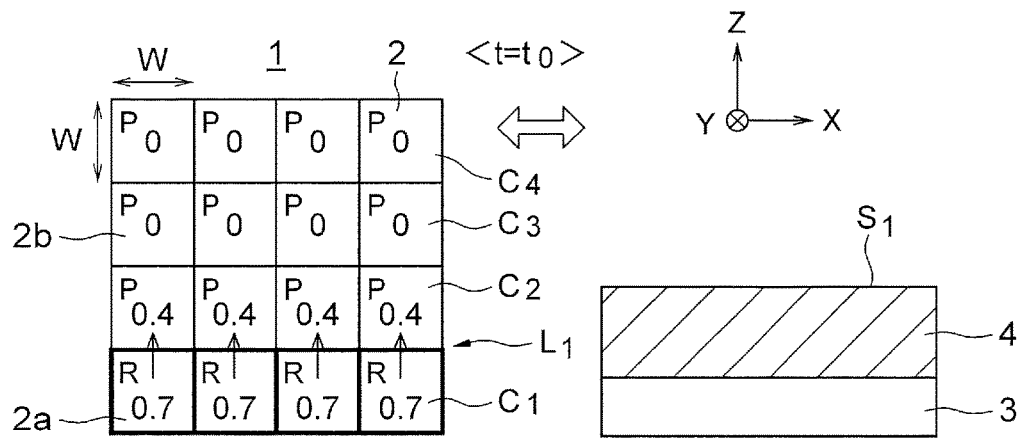
FIGS. 2A to 2C are diagrams illustrating a procedure for the topography simulation method of the first embodiment.
Figure 2B:
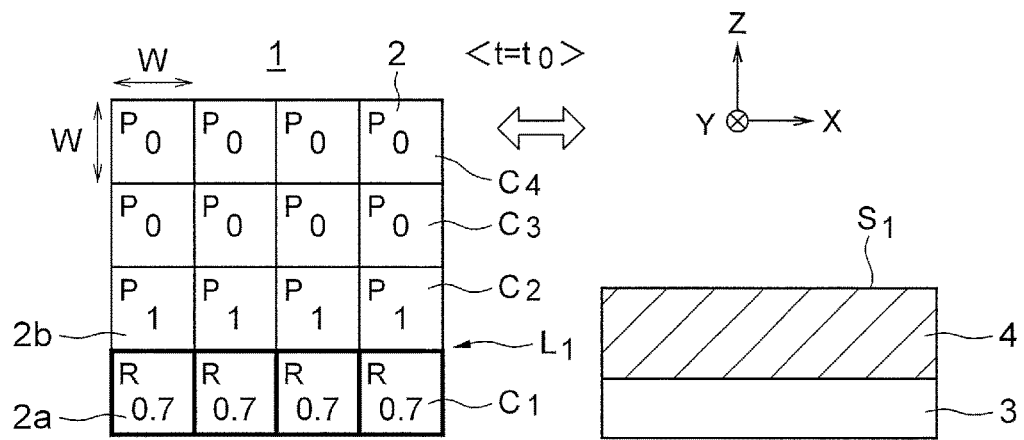
Figure 2C:
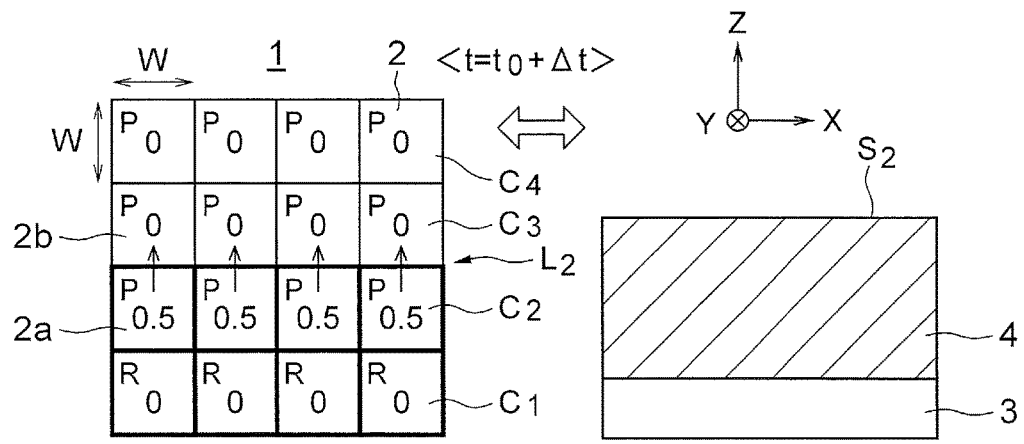

FIGS. 2A to 2C are diagrams illustrating a procedure for the topography simulation method of the first embodiment.

FIG. 2A illustrates the calculating area 1 at a point in time "$t_0$". Four cells 2 in the first stage in FIG. 2A are filled cells 2a with a deposition rate "R" of 0.7. Four cells 2 in the second stage in FIG. 2A are vacant cells 2b with a deposition rate "R" of 0.4. A boundary between the filled cell 2a and the vacant cell 2b is denoted by reference character $L_1$. A surface of the deposited film 4 which corresponds to the boundary $L_1$ is denoted by reference character $S_1$. In FIG. 2A, the substance deposits on the filled cells 2a in the first stage to fill the vacant cells 2b in the second stage with the substance, increasing the filling ratio "P" of the vacant cells 2b in the second stage.

Now, a filling rate "ΔP" for each vacant cell 2b will be described. The filling rate "ΔP" represents the amount of the substance filling each vacant cell 2b per unit time. The filling rate "ΔP" of the present embodiment is set equal to the amount of the substance filling each vacant cell 2b per topography simulation time step "Δt".

In the present embodiment, when the filling ratio "P" for a certain vacant cell 2b changes from 0 to 1 per unit time, the filling rate "ΔP" for the vacant cell 2b is set to 1. This corresponds to the setting, to 1, of the amount of the substance at which the filling ratio "P" of one vacant cell 2b changes from 0 to 1. That is, this corresponds to the setting the amount of the substance in one filled cell 2a to 1.

Therefore, when the filling ratio "P" of a certain vacant cell 2b changes from "P(t₀)" to "P(t₀+Δt)" between a point in time "t₀" and a point in time "t₀+Δt", the filling rate "ΔP" for the vacant cell 2b is given by Equation (1).

$$\Delta P = P(t_0 + \Delta t) - P(t_0) \quad (1)$$

In the present embodiment, the filling rate "ΔP" for each vacant cell 2b is determined by the deposition rate "R" for the filled cell 2a neighboring to the vacant cell 2b. For example, the filling rate "ΔP" for a vacant cell $C_2$ in FIG. 2 is determined by the deposition rate "R" for a filled cell $C_1$. Specifically, the deposition rate "R" for the filled cell $C_1$ is 0.7, and consequently, the filling rate "ΔP" for the vacant cell $C_2$ is determined to be 0.7. This corresponds to deposition of the substance with a deposition amount of 0.7 on the surface of the filled cell $C_1$ and entry of the substance with a deposition amount of 0.7 into the vacant cell $C_2$.

Therefore, the filling rate "ΔP" for each of the vacant cells 2b in the second stage in FIG. 2A is 0.7. However, the filling ratio "P" for each of the vacant cells 2b in the second stage is 0.4, and consequently, the filling ratio "P" for each of the vacant cells 2b in the second stage increases by 0.6 and changes to 1 (FIG. 2B). As a result, each of the vacant cells 2b in the second stage changes to the filled cells 2a between the point in time "t₀" and the point in time "t₀+Δt" (FIG. 2C). FIG. 2C illustrates that the boundary $L_1$ has changed to a boundary $L_2$ and that a surface $S_1$ of the deposited film 4 has changed to a surface $S_2$. FIG. 2C further illustrates that the deposition rate "R" for each of the filled cells 2a in the second stage has newly been set to 0.5.

The deposition rate "R" of the present embodiment is set according to the same rule as that for the filling rate "ΔP". Specifically, when one filled cell 2a changes the filling ratio "P" for one vacant cell 2b from 0 to 1 per unit time, the deposition rate "R" for the filled cell 2a is set to 1. Therefore, in the description of FIG. 2A, when the deposition rate "R" for the filled cell $C_1$ is 0.7, the filling rate "ΔP" for the vacant cell $C_2$ is also set to 0.7.

Furthermore, since the present embodiment is applied to the deposition process, the filling ratio "P" for each vacant cell 2b increases over time, and the filling rate "ΔP" for each vacant cell 2b has a positive value. On the other hand, when the present embodiment is applied to the etching process, the filling ratio "P" for each vacant cell 2b decreases over time, and the filling rate "ΔP" for each vacant cell 2b has a negative value.

When the distribution of the filled cells 2a and the vacant cells 2b is more complicated than the distribution in FIG. 2A, the calculation method for the filling rate "ΔP" of the present embodiment is more complicated. The calculation method for the filling rate "ΔP" of the present embodiment will be described below.

Figure 3A:
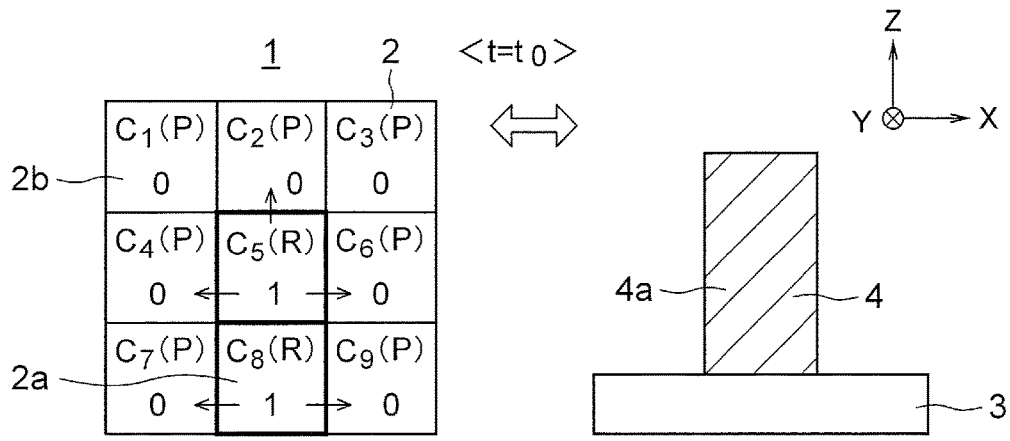
FIGS. 3A to 3C are diagrams illustrating a first problem with a topography simulation method in a comparative example of the first embodiment.
Figure 3B:
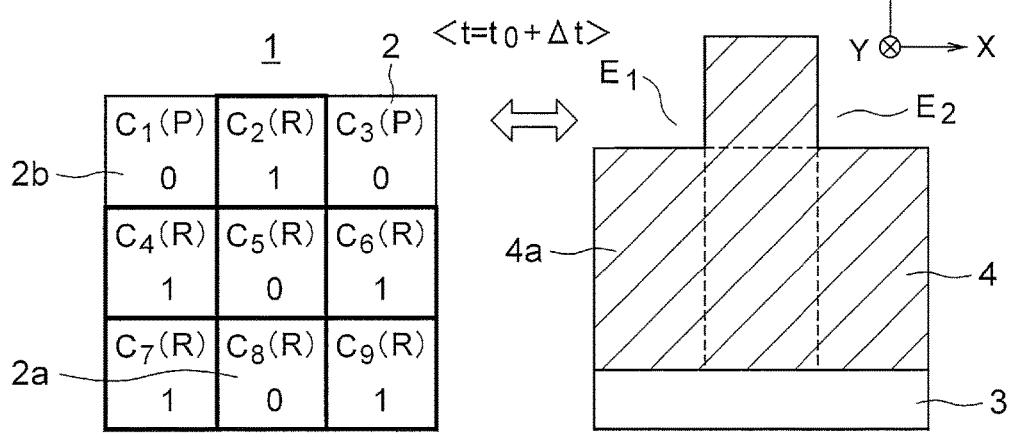
Figure 3C:
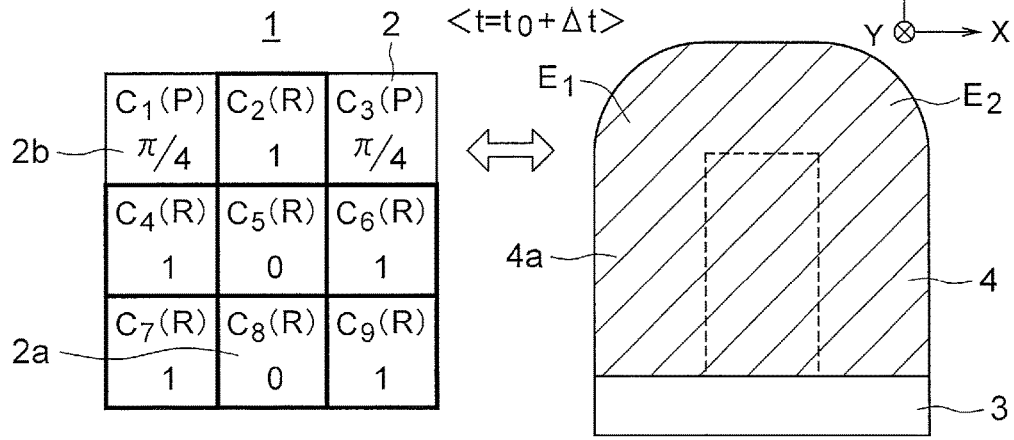

(1) Problems with Topography Simulation Method in Comparative Example of First Embodiment FIGS. 3A to 3C are diagrams illustrating a first problem with a topography simulation method in a comparative example of the first embodiment.

FIG. 3A illustrates the calculating area 1 at the point in time "t₀" and nine cells 2 in the calculating area 1. The cells 2 include two cells $C_5$ and $C_8$ that are the filled cells 2a and seven cells $C_1$ to $C_4$, $C_6$, $C_7$, and $C_9$ that are the vacant cells 2b. The cells $C_5$ and $C_8$ have a deposition rate "R" of 1. The cells $C_1$ to $C_4$, $C_6$, $C_7$, and $C_9$ have a filling ratio "P" of 0. The calculating area 1 in the left of FIG. 3A represents the deposited film 4 having the convex portion 4a as in the right of FIG. 3A.

The calculating area 1 in FIG. 3A changes as illustrated in FIG. 3B during a time step "Δt". FIG. 3B illustrates the calculating area 1 at the point in time "t₀+Δt". In FIG. 3B, the five cells $C_2$, $C_4$, $C_6$, $C_7$, and $C_9$ change from the vacant cells 2b to the filled cells 2a. The calculating area 1 in the left of FIG. 3B represents the convex portion 4a as illustrated in the right of FIG. 3B. Areas corresponding to the cells $C_1$ and $C_3$ that are the vacant cells 2b are denoted by reference characters $E_1$ and $E_2$. The cells $C_1$ and $C_3$ have a filling ratio "P" of 0.

However, in actual semiconductor fabrication steps, the convex portion 4a in FIG. 3A is expected to change as illustrated in FIG. 3C during the time step "Δt". The areas $E_1$ and $E_2$ in FIG. 3C include a part of the deposited film 4.

It is impossible to express, on the calculating area 1, the structure in which the areas $E_1$ and $E_2$ include a part of the deposited film 4 as described above. However, when the areas $E_1$ and $E_2$ including a part of the deposited film 4 are interpreted to correspond to the cells $C_1$ and $C_3$ with a filling ratio "P" of more than 0, the convex portion 4a in the right of FIG. 3C is considered to correspond to the calculating area 1 in the left of FIG. 3C. In FIG. 3C, the cross-sectional shape of the deposited film 4 in the areas $E_1$ and $E_2$ is a quarter of a circle. Consequently, the filling ratio "P" for the cells $C_1$ and $C_3$ is π/4.

The calculating area 1 in FIG. 3A desirably changes as illustrated in FIG. 3C during the time step "Δt". However, according to the topography simulation method in the comparative example, the calculating area 1 in FIG. 3A changes as illustrated in FIG. 3A. As described above, in the topography simulation method in the comparative example, the change in the deposited film 4 with the convex portion 4a is underestimated. The reason is that the amount of deposition in the areas $E_1$ and $E_2$ is excessively small.

Figure 4A:
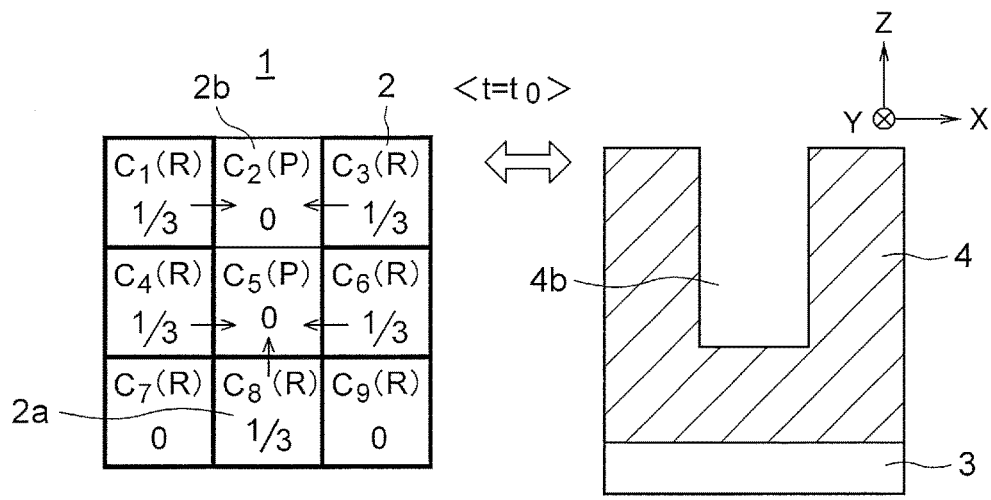
FIGS. 4A to 4C are diagrams illustrating a second problem with the topography simulation method in the comparative example of the first embodiment.
Figure 4B:
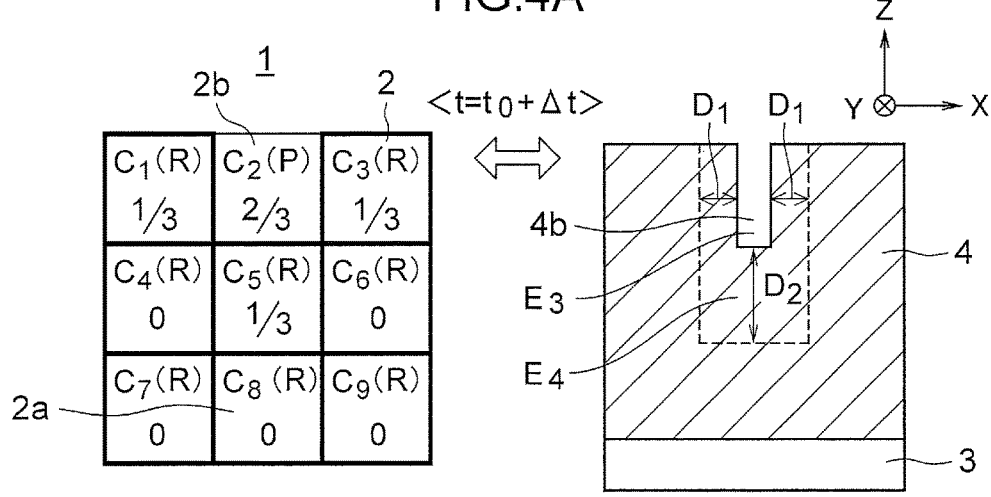
Figure 4C:
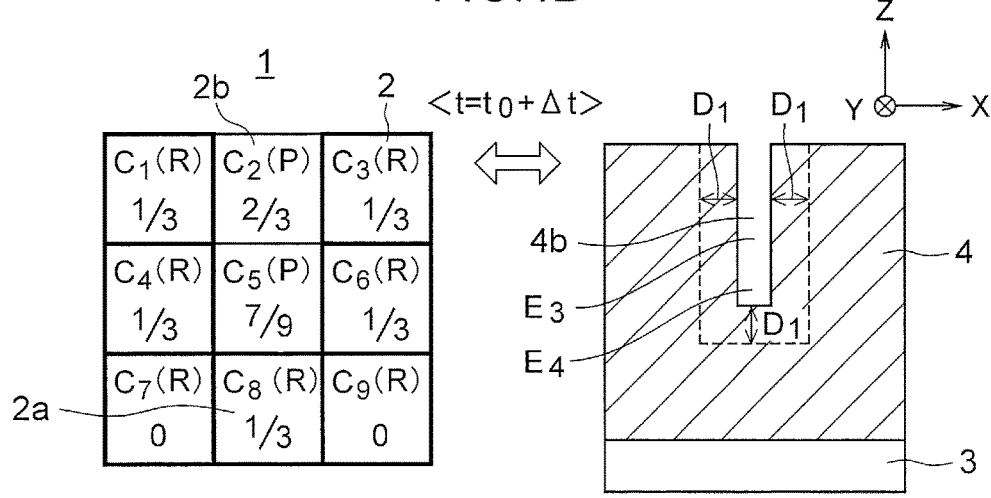

FIGS. 4A to 4C are diagrams illustrating a second problem with the topography simulation method in the comparative example of the first embodiment.

FIG. 4A illustrates the calculating area 1 at the point in time "t₀" and nine cells 2 in the calculating area 1. The cells 2 include seven cells $C_1$, $C_3$, $C_4$, and $C_6$ to $C_9$ that are the filled cells 2a and two cells $C_2$ and $C_5$ that are the vacant cells 2b. The cells $C_1$, $C_3$, $C_4$, and $C_6$ to $C_9$ have a deposition rate "R" of 1/3. The cells $C_2$ and $C_5$ have a filling ratio "P" of 0. The calculating area 1 in the left of FIG. 4A represents the deposited film 4 with the concave portion 4b as in the right of FIG. 4A.

The calculating area 1 in FIG. 4A changes as illustrated in FIG. 4B during a time step "Δt". FIG. 4B illustrates the calculating area 1 at the point in time "t₀+Δt". In FIG. 4B, the filling ratio "P" for the cell $C_5$ is the sum of the filling rates "R" for the cells $C_4$, $C_6$, and $C_8$, and the filling ratio "P" for the cell $C_5$ has changed from 0 to 1, with the result that the cell $C_5$ has changed from the vacant cell $2b$ to the filled cell $2a$. An area corresponding to the cell $C_2$ that is the vacant cell $2b$ and an area corresponding to the cell $C_5$ that is the filled cell $2a$ are denoted by reference characters $E_3$ and $E_4$, respectively. The cell $C_2$ has a filling ratio "P" of 2/3.

The calculating area 1 in the left of FIG. 4B represents the concave portion $4b$ as illustrated in the right of FIG. 4B. However, the cell $C_2$ having a filling ratio "P" of more than 0 is interpreted to represent an area E3 including a part of the deposited film 4. The film thicknesses of the deposited film 4 newly deposited on a side surface and a bottom surface of the concave portion $4b$ during the time step "Δt" are denoted by reference characters "$D_1$" and "$D_2$", respectively. In FIG. 4B, the film thickness "$D_2$" is larger than the film thickness "$D_1$" ("$D_2$">"$D_1$").

However, in the actual semiconductor fabrication steps, the concave portion $4b$ in FIG. 4A is expected to change during the time step "Δt" as illustrated in FIG. 4C. In FIG. 4C, the film thickness "$D_2$" is equal to the film thickness "$D_1$" ("$D_2$"="$D_1$"). Therefore, the area $E_4$ in FIG. 4C includes a part of the deposited film 4. The cell $C_5$ in FIG. 4C is the vacant cell $2b$ with a filling ratio "P" of 7/9.

The calculating area 1 in FIG. 4A desirably changes as illustrated in FIG. 4C during the time step "Δt". However, according to the topography simulation method in the comparative example, the calculating area 1 in FIG. 4A changes as illustrated in FIG. 4B. As described above, in the topography simulation method in the comparative example, the change in the deposited film 4 with the concave portion $4b$ is overestimated. The reason is that the amount of deposition in the area $E_4$ is excessively large.

A similar problem occurs when the topography simulation method of the present embodiment is applied to etching. For example, when the present embodiment is applied to the etching of the convex portion $4a$, the deposited film 4 forming the convex portion $4a$ decreases by an excessively large amount. Specifically, corners of the convex portion $4a$ are etched by an excessively large amount. On the other hand, when the present embodiment is applied to the etching of the concave portion $4b$, the deposited film 4 forming the concave portion $4b$ decreases by an excessively large amount. Specifically, corners of the concave portion $4b$ are etched by an excessively large amount.

(2) Details of Topography Simulation Method of First Embodiment

FIGS. 5A to 6B are diagrams illustrating standard types of neighboring cells of each target cell in the topography simulation method of the first embodiment.

Each of FIGS. 5A to 6B illustrates one target cell that is the cell 2 for which the filling rate "ΔP" is to be calculated and eight neighboring cells that are the cells 2 neighboring to the target cell. The target cell is denoted by reference character C. The filling rate "ΔP" for the target cell C of the present embodiment depends on the deposition rates "R" for the neighboring cells. Therefore, the filling rate "ΔP" for the target cell C of the present embodiment is calculated based on the deposition rates "R" for the neighboring cells.

The neighboring cells neighboring to the target cell C include four first neighboring cells sharing a side with the target cell C and four second neighboring cells sharing a corner with the target cell C. In FIGS. 5A to 6B, the first neighboring cells are denoted by reference characters $C_1$ to $C_4$. In FIG. 6A, one of the second neighboring cells is denoted by reference character $C_5$. Each of the first neighboring cells neighbors to the target cell C at a first distance W from the target cell C. Each of the second neighboring cells neighbors to the target cell C at a second distance $2^{1/2} \times W$ from the target cell C. In this case, the square root of 2 is denoted by $2^{1/2}$. The first and second distances each indicate the distance between the centers of the cells 2.

In the topography simulation method in the comparative example in FIGS. 3A to 4C, the filling rate "ΔP" for the target cell C is calculated based on the deposition rates "R" for the four first neighboring cells. On the other hand, in the present embodiment, the filling rate "ΔP" for the target cell C is calculated based on the deposition rates "R" for the eight first and second neighboring cells.

Furthermore, in the topography simulation method in FIGS. 3A to 4C, 100% of the deposition rate "R" for each neighboring cell contributes to the filling rate "ΔP" for the target cell C. For example, the cell $C_5$ illustrated in FIG. 4A has a filling rate ΔP of 1, which is the sum of a deposition rate "R" (=1/3) of 100% for the cell $C_4$, a deposition rate "R" (=1/3) of 100% for the cell $C_6$, and a deposition rate "R" (=1/3) of 100% for the cell $C_8$.

On the other hand, in the present embodiment, 100% of the deposition rate "R" for each neighboring cell does not necessarily contribute to the filling rate "ΔP" for the target cell C. For example, the higher of the deposition rates "R" for the two neighboring cells may contribute to the filling rate "ΔP", whereas the lower of the deposition rates "R" for the two neighboring cells may fail to contribute to the filling rate "ΔP". In this case, 100% of the deposition rate "R" for the former neighboring cell and 0% of the deposition rate "R" for the latter neighboring cell contribute to the filling rate "ΔP" for the target cell C.

Then, when the filling rate "ΔP" for the target cell C of the present embodiment is calculated, the contributing rate of each of the neighboring cells neighboring to the target cell C which contributes to the filling rate "ΔP" for the target cell C is calculated based on the deposition rates "R" for the neighboring cells C. Then, the filling rate "ΔP" for the target cell C is calculated based on the contributing rates of the neighboring cells. The contributing rate of each neighboring cell may be 100% or 0% of the deposition rate "R". The contributing rate of each of the neighboring cells neighboring to the target cell C of the present embodiment depends on whether the other neighboring cells neighboring to the target cell C are the filled cells $2a$ or the vacant cells $2b$, as described with reference to FIGS. 5A to 6B.

The filled cell $2a$ is an example of a first cell with the filling ratio "P" belonging to a first range. The first range of the present embodiment is "P"=1. The vacant cell $2b$ is an example of a second cell belonging to a second range that is different in the filling ratio "P" from the first range. The second range of the present embodiment is $0 \le$"P"$<1$.

The contributing rate of the first neighboring cells is appropriately referred to as a "first contributing rate". Furthermore, the contributing rate of the second neighboring cells is appropriately referred to as a "second contributing rate". The filling rate "ΔP" for the target cell C of the present embodiment is calculated based on the first and second contributing rates.

Figure 5A:
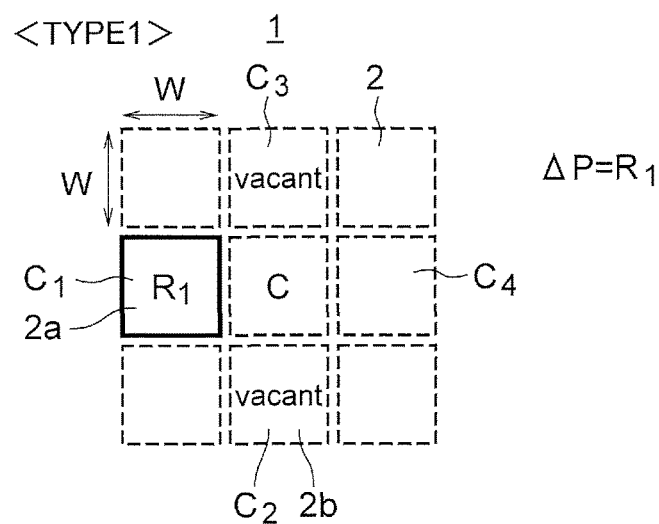
FIGS. 5A to 6B are diagrams illustrating standard types of neighboring cells of each target cell in the topography simulation method of the first embodiment.
Figure 6A:
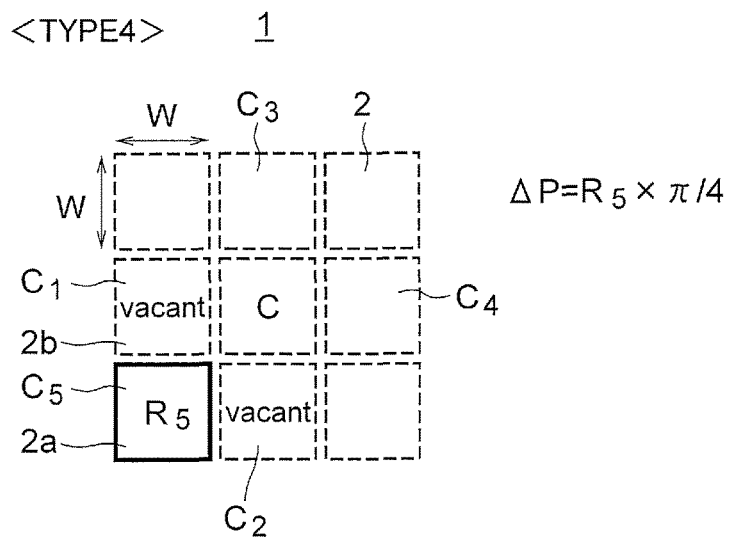

FIG. 5A illustrates neighboring cells of TYPE1. In FIG. 5A, the cell $C_1$ is the filled cell $2a$, and the cells $C_2$ and $C_3$, which neighbor to the cell $C_1$, are the vacant cells $2b$. The cell $C_4$, which is opposite to the $C_1$, may be either the filled cell $2a$ or the vacant cell $2b$. The four second neighboring cells may be the filled cells $2a$ or the vacant cells $2b$. In this case, the filling rate "ΔP" for the target cell C is given by Equation (2).

$$\Delta P = R_1 \quad (2)$$

In Equation (2), the deposition rate for the cell $C_1$ is denoted by $R_1$. Equation (2) means that the contributing rate of the cell $C_1$ is 100% of the deposition rate "$R_1$" for the cell $C_1$. The filling rate "$\Delta P$" also depends on the cell $C_4$ and two neighboring cells neighboring to the cell $C_4$. This will be described below with reference to FIG. 7A and FIG. 7B.

Figure 5B:
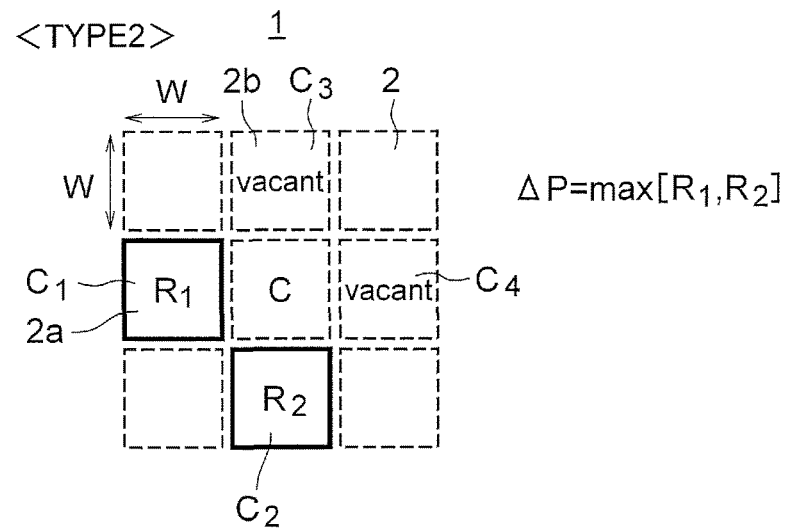

FIG. 5B illustrates neighboring cells of TYPE2. In FIG. 5B, the neighboring cells $C_1$ and $C_2$ neighboring to each other are the filled cells $2a$, and the cells $C_3$ and $C_4$ are the vacant cells $2b$. The four second neighboring cells may be either the filled cells $2a$ or the vacant cells $2b$. In this case, the filling rate "$\Delta P$" for the target cell C is given by Equation (3).

$$\Delta P = \max[R_1, R_2] \quad (3)$$

In Equation (3), the deposition rate for the cell $C_2$ is denoted by "$R_2$". The filling rate "$\Delta P$" in FIG. 5B matches the higher of the deposition rates "$R_1$" and "$R_2$". This means that, when, for example, "$R_1$" is higher than "$R_2$", the contributing rate of the cell $C_1$ is 100% of the deposition rate "$R_1$", whereas the contributing rate of the cell $C_2$ is 0% of the deposition rate "$R_2$". In other words, the total contributing rate of the cells and $C_2$ is not equal to the sum of the deposition rates "$R_1$" and "$R_2$" but is equal to the higher of the deposition rates "$R_1$" and "$R_2$". The filling rate "$\Delta P$" in FIG. 5B depends on one second neighboring cell neighboring to the cells $C_3$ and $C_4$. This will be described with reference to FIG. 7A and FIG. 7B.

Figure 5C:
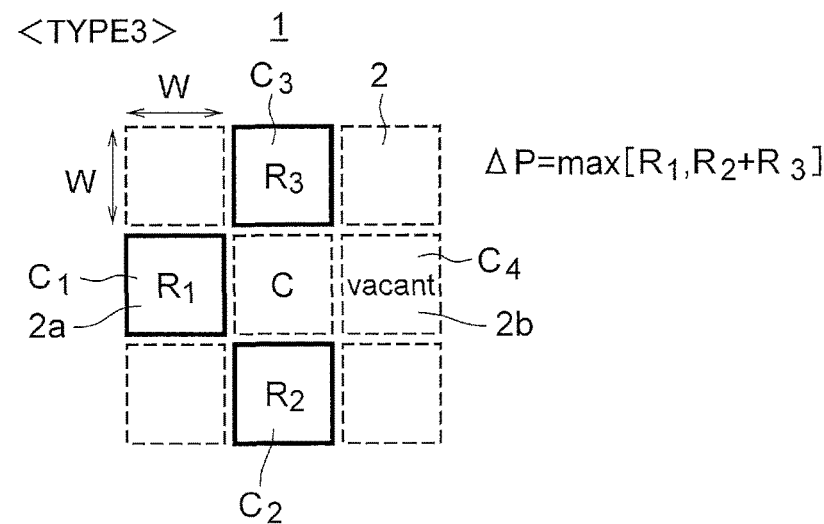

FIG. 5C illustrates neighboring cells of TYPE3. In FIG. 5C, the cell $C_1$ is the filled cell $2a$, and the cells $C_2$ and $C_3$, which neighbor to the cell $C_1$, are also the filled cells $2a$. The cell $C_4$, which is opposite to the $C_1$, is the vacant cell $2b$. The four second neighboring cells may be either the filled cells $2a$ or the vacant cells $2b$. In this case, the filling rate "$\Delta P$" for the target cell C is given by Equation (4).

$$\Delta P = \max[R_1, R_2 + R_3] \quad (4)$$

In Equation (4), the deposition rate for the cell $C_3$ is denoted by $R_3$. The filling rate "$\Delta P$" in FIG. 5C matches the higher of the deposition rates "$R_1$" and "$R_2 + R_3$". This means that, when, for example, "$R_1$" is higher than "$R_2 + R_3$", the contributing rate of the cell $C_1$ is 100% of the deposition rate "$R_1$", whereas the contributing rates of the cells $C_2$ and $C_3$ are 0% of the deposition rate "$R_2$" and "$R_3$", respectively. On the other hand, when, for example, "$R_1$" is lower than "$R_2 + R_3$", the contributing rate of the cell $C_1$ is 0% of the deposition rate "$R_1$", whereas the contributing rates of the cells $C_2$ and $C_3$ are 100% of the deposition rate "$R_2$" and "$R_3$", respectively. In other words, the total contributing rate of the cells $C_1$, $C_2$, and $C_3$ is not equal to the sum of "$R_1$", "$R_2$", and "$R_3$" but is equal to the higher of "$R_1$" and "$R_2 + R_3$".

In the present embodiment, the calculation accuracy for the filling rate "$\Delta P$" in the simulation of processing of the concave portion $4b$ in FIGS. 4A to 4C can be improved by using calculation methods of TYPE2 and TYPE3. For example, since the filling rate "$\Delta P$" of TYPE2 is not equal to the sum of the deposition rates "$R_1$" and "$R_2$" but is equal to the higher of the deposition rates "$R_1$" and "$R_2$", the overestimation of changes in the deposited film 4 with the concave portion $4b$ can be corrected.

FIG. 6A illustrates neighboring cells of TYPE4. In FIG. 6A, the cells $C_1$ and C2, which neighbor to each other, are the vacant cells $2b$, and the cell $C_5$ (second neighboring cell), which neighbors to the cells $C_1$ and $C_2$, are the filled cells $2a$. The other neighboring cells may be either the filled cells $2a$ or the vacant cells $2b$. In this case, the filling rate "$\Delta P$" for the target cell C is given by Equation (5).

$$\Delta P = R_5 \times \pi/4 \quad (5)$$

In Equation (5), the deposition rate for the cell $C_5$ is denoted by "$R_5$". The coefficient $\pi/4$ is an example of a positive constant that is smaller than 1. An approximate value for $\pi/4$ is 0.785. Therefore, Equation (5) means that the contributing rate of the cell $C_5$ is 78.5% of the deposition rate "$R_5$" of the cell $C_5$. The filling rate "$\Delta P$" in FIG. 6A depends on the neighboring cells other than the cells $C_1$, $C_2$, and $C_5$. This will be described with reference to FIG. 7A and FIG. 7B.

In the present embodiment, the calculation accuracy for the filling rate "$\Delta P$" in the simulation of processing of the convex portion $4a$ in FIGS. 3A to 3C can be improved by using a calculation method of TYPE4. For example, since the filling rate "$\Delta P$" of TYPE4 is not 0 but is $R_5 \times \pi/4$, the underestimation of changes in the deposited film 4 with the convex portion $4a$ can be corrected.

The target cell C of TYPE4 corresponds to the cell $C_1$ or $C_3$ in FIG. 3C. In the present embodiment, the filling rate "$\Delta P$" of TYPE4 is set to "$R_5$"$\times \pi/4$ rather than to "$R_5$". This enables more accurate simulation of a process in which the areas $E_1$ and $E_2$ including a part of the deposited film 4 is formed as in FIG. 3C. Furthermore, the coefficient $\pi/4$ in Equation (5) may be replaced with another positive constant that is smaller than 1.

Figure 6B:
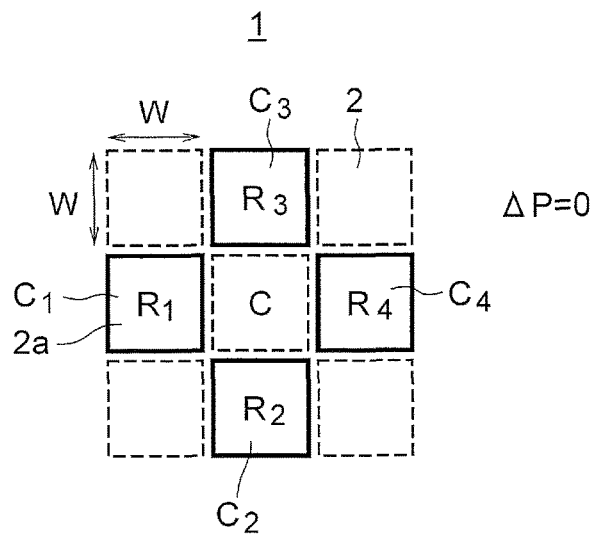

FIG. 6B illustrates a case where the cells $C_1$ to $C_4$ are all the filled cells $2a$. The four second neighboring cells may be either the filled cells $2a$ or the vacant cells $2b$. In this case, the filling rate "$\Delta P$" for the target cell C is given by Equation (6).

$$\Delta P = 0 \quad (6)$$

Equation (6) means that the contributing rates of the cells $C_1$ to $C_4$ are 0% of the deposition rates "$R_1$" to "$R_4$" for the cells $C_1$ to $C_4$, respectively. In other words, the total contributing rate of the cells $C_1$ to $C_4$ is not equal to the sum of the deposition rates "$R_1$" to "$R_4$" and is equal to 0. This indicates that, since the target cell C is surrounded by the four filled cells $2a$, the substance fails to reach the target cell C, preventing an increase in the filling ratio "P" for the target cell C.

As described above, the contributing rate of each of the neighboring cells neighboring to the target cell C of the present embodiment depends on whether the neighboring cells, which are different from the target cell C, are the filled cells $2a$ or the vacant cells $2b$.

Specifically, the contributing rate of each of the first neighboring cells depends on whether the first neighboring cells, which are different from the target cell C, are the filled cells $2a$ or the vacant cells $2b$. For example, the contributing rate for the cell $C_1$ is 100% of the deposition rate "$R_1$" when the cells $C_2$ and $C_3$ are the vacant cells $2b$ (FIG. 5A). Furthermore, the contributing rate for the cell $C_1$ is 100% or 0% of the deposition rate "$R_1$" when the cells $C_2$ and $C_3$ are the filled cells $2a$, whereas the cell $C_4$ is the vacant cells $2b$ (FIG. 5C). Additionally, the contributing rate for the cell $C_1$ is 0% of the deposition rate "$R_1$" when the cells $C_2$ to $C_4$ are the filled cells $2a$ (FIG. 6B).

On the other hand, the contributing rate of each of the second neighboring cells depends on whether the first neighboring cells, which neighbor to the respective second neighboring cells, are the filled cells $2a$ or the vacant cells $2b$. For example, the contributing rate for the cell $C_5$ (second neighboring cell) is 78.5% of the deposition rate "$R_5$" when the cells $C_1$ and $C_2$ (first neighboring cells), which neighbor to the cell $C_5$, are the vacant cells $2b$ (FIG. 6A). Furthermore, the contributing rate for the cell $C_5$ is 0% of the deposition rate "$R_5$" when at least one of the cells $C_1$ and $C_2$ is the filled cell $2a$ (FIGS. 5A to 5C and FIG. 6B). The contributing rate of each of the second neighboring cells of the present embodiment does not depend on whether the second neighboring cells, which are different from the target cell C, are the filled cells $2a$ or the vacant cells $2b$.

FIGS. 7A and 7B are diagrams illustrating irregular types of the neighboring cells of each target cell in the topography simulation method of the first embodiment.

FIG. 7A illustrates the cells $C_1$ and $C_2$ that are first neighboring cells neighboring to the target cell C and which neighbor to each other. The cells $C_1$ and $C_2$ are the filled cells $2a$ having the deposition rates "$R_1$" and "$R_2$", respectively. On the other hand, the other first neighboring cells neighboring to the target cell C are the vacant cells $2b$.

In this case, the filling rate "$\Delta P$" for the target cell C is calculated by considering the calculating area 1 in FIG. 7A to be synthesis of two TYPE1s. Therefore, the filling rate "$\Delta P$" for the target cell C is given by Equation (7).

$$\Delta P = R_1 + R_2 \quad (7)$$

Equation (7) means that the contributing rates of the cells $C_1$ and $C_2$ are 100% of the deposition rates "$R_1$" and "$R_2$" for the cells $C_1$ and $C_2$, respectively. In other words, the total contributing rate of the cells $C_1$ and $C_2$ is the sum of the deposition rates "$R_1$" and "$R_2$".

FIG. 7B illustrates the target cell C, the cell $C_1$, which is the first neighboring cell neighboring to the target cell C, and the cell $C_2$, which is the second neighboring cell neighboring to the target cell C and which does not neighbor to the cell $C_1$. The cells $C_1$ and $C_2$ are the filled cells $2a$ having the deposition rates "$R_1$" and "$R_2$", respectively. On the other hand, the other first neighboring cells neighboring to the target cell C are the vacant cells $2b$.

In this case, the filling rate "$\Delta P$" for the target cell C is calculated by considering the calculating area 1 in FIG. 7B to be synthesis of TYPE1 and TYPE4. Therefore, the filling rate "$\Delta P$" for the target cell C is given by Equation (7).

$$\Delta P = R_1 + R_2 \times \pi/4 \quad (8)$$

Equation (8) means that the contributing rate of the cell $C_1$ is 100% of the deposition rate "$R_1$", and the contributing rate of the cell $C_2$ is 78.5% of the deposition rate "$R_2$".

When the topography simulation method of the present embodiment is applied to the deposition process, the target cell C is the cell 2 with a filling ratio "P" of at least 0 and less than 1 (0≤"P"<1). Therefore, when the present embodiment is applied to the deposition process, the target cell C is the vacant cell $2b$. On the other hand, when the topography simulation method of the present embodiment is applied to the etching process, the target cell C is the cell 2 having a filling ratio "P" of more than 0 and at most 1 (0<"P"≤1). Therefore, when the present embodiment is applied to the etching process, the target cell C is the filled cell $2a$, or the vacant cell $2b$ with a filling ratio "P" of other than 0.

Furthermore, when the present embodiment is applied to the etching process, the vacant cell $2b$ with a filling ratio "P" of 0 has an etching rate as a variable. Moreover, the cell $C_1$ in FIG. 5A, the cells $C_1$ and $C_2$ in FIG. 5B, the cells $C_1$ to $C_3$ in FIG. 5C, the cell $C_5$ in FIG. 6A, and the cells $C_1$ to $C_4$ in FIG. 6B are replaced with the vacant cells $2b$ with a filling ratio "P" of 0. Furthermore, the cells $C_2$ and $C_3$ in FIG. 5A, the cells $C_3$ and $C_4$ in FIG. 5B, the cell $C_4$ in FIG. 5C, and the cells $C_1$ and $C_2$ in FIG. 6A are replaced with the filled cells $2a$, or the vacant cells $2b$ with a filling ratio "P" of other than 0.

When the present embodiment is applied to the etching process, the vacant cell $2b$ with a filling ratio "P" of 0 is an example of the first cell with the filling ratio "P" belonging to the first range. The first range in this case is "P"=0. Moreover, the filled cell $2a$, or the vacant cell $2b$ with a filling ratio "P" of other than 0 is an example of the second cell with the filling ratio "P" belonging to the second range, which is different from the first range. The second range in this case is 0<"P"≤0.

The first cell, the second cell, the first range, and the second range may be set under conditions different from the conditions for the deposition process or the etching process.

(3) Procedure for Topography Simulation Method of First Embodiment

Figure 8:
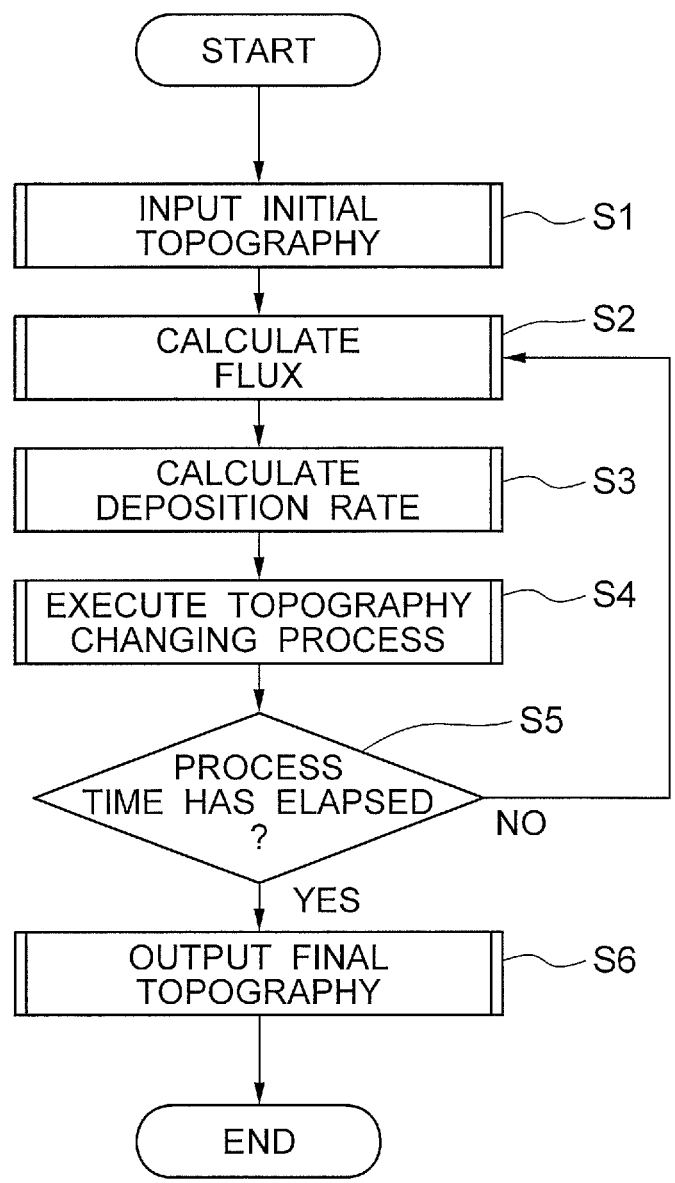
FIG. 8 is a flowchart illustrating a procedure for the topography simulation method of the first embodiment.

FIG. 8 is a flowchart illustrating a procedure for the topography simulation method of the first embodiment.

In the topography simulation method of the present embodiment, the initial topography of the substance is input to the information processing apparatus (step S1). The information processing apparatus of the present embodiment divides the calculating area 1 for the topography of the substance into a plurality of the cells 2 and expresses the initial topography of the substance using the filled cells $2a$, which are filled with the substance, and the vacant cells $2b$, which are not filled with the substance, for example, as illustrated in FIG. 2A. A block in which the processing in step S1 is executed is an example of a division module.

In step S1, the filling ratio "P" for each vacant cell $2b$ is also set. The filling ratio "P" for each vacant cell $2b$ may be input to the information processing apparatus by the user or automatically set by the information processing apparatus based on the initial topography of the substance and the like.

Then, the flux of a reaction species reaching each cell 2 is calculated (step S2). An example of the reaction species is ions or molecules. Since the topography simulation method of the present embodiment is applied to the deposition process, the reaction species is a deposition species. On the other hand, when the topography simulation method of the present embodiment is applied to the etching process, the reaction species is an etching species.

Then, the deposition rate "R" for each filled cell $2a$ is calculated based on the flux of the reaction species (step S3). The deposition rate "R" for each filled cell $2a$ is calculated, for example, as illustrated in FIG. 2A. When the topography simulation method of the present embodiment is applied to the etching process, the etching rate is calculated instead of the deposition rate "R".

Then, a topography changing process is executed to change the topography of the substance, that is, the distribution of the filled cells $2a$ and the vacant cells $2b$ (step S4). Specifically, the filling rate "$\Delta P$" for each vacant cell $2b$ at the point in time "$t_0$" is calculated based on the deposition rate "R" for the filled cells $2a$ at the point in time "$t_0$". The filling ratio "P" for each vacant cell $2b$ at the point in time "$t_0+\Delta t$" is calculated based on the filling rate "$\Delta P$" for each vacant cell $2b$ at the point in time "$t_0$". At this time, the vacant cells $2b$ for which the filling ratio "P" has reached 1 are changed to the filled cells $2a$ as illustrated in FIG. 2C. A block in which the processing in step S4 is executed is an example of the calculation module.

Then, the procedure determines whether or not a preset process time has elapsed (step S5). When the process time has elapsed, the final topography of the substance is output (step S6), and the simulation ends. When the process time has not elapsed, the procedure returns to step S2.

Figure 9:
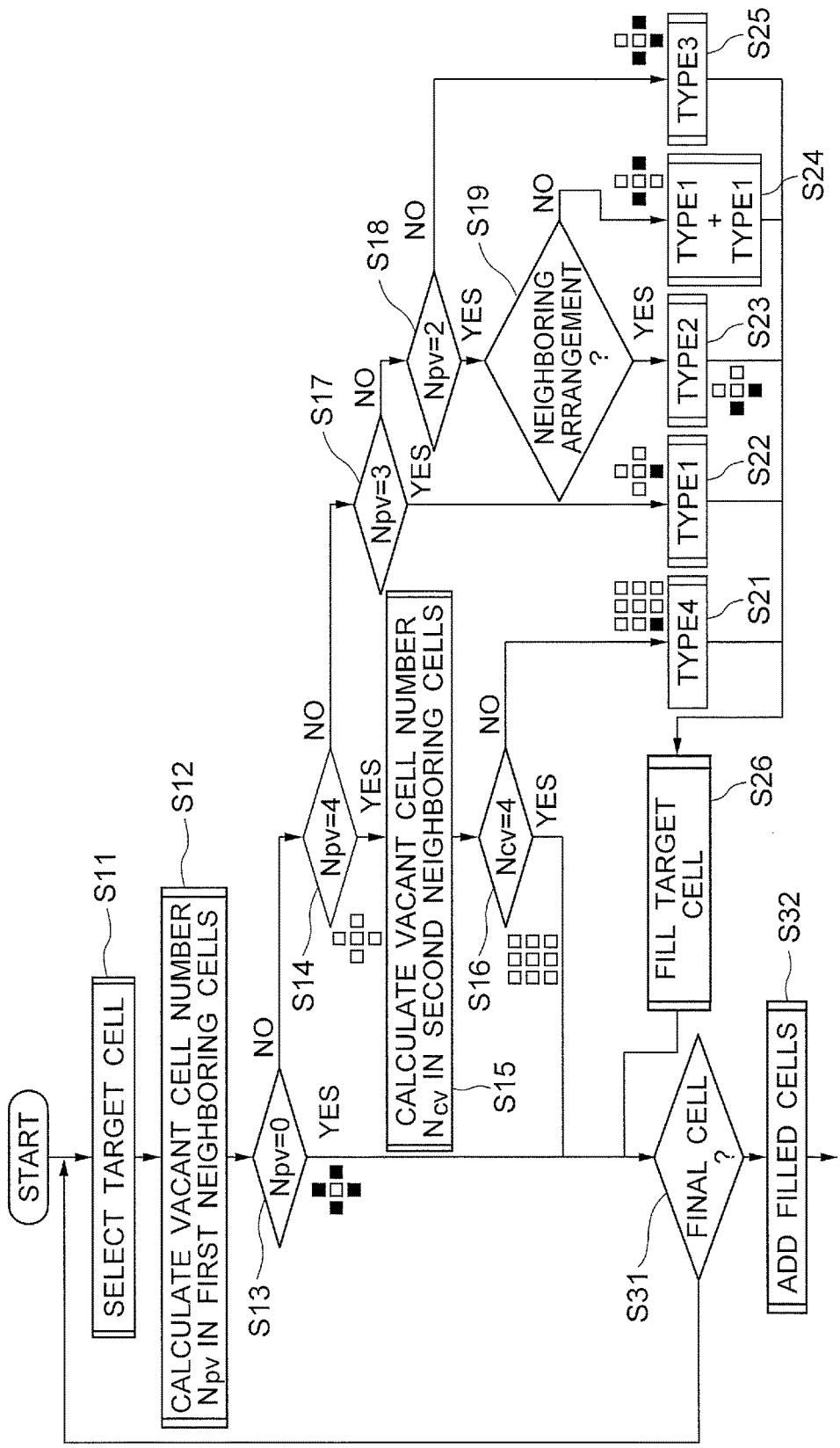
FIG. 9 is a flowchart illustrating details of step S4 in FIG. 8.

FIG. 9 is a flowchart illustrating details of step S4 in FIG. 8. In the description of FIG. 9, the reference characters and numerals illustrated in FIGS. 5A to 7B are appropriately used.

First, one target cell C is selected (step S11). Then, the number Npv of the vacant cells $2b$ included in the four first neighboring cells neighboring to the target cell C is calculated (step S12). The number Npv is hereinafter referred to as the first vacant cell number.

When the first vacant cell number "Npv" is 0 (step S13), the neighboring cells neighboring to the target cell C have the distribution illustrated in FIG. 6B. Therefore, the filling rate "ΔP" of the target cell C in this case is 0.

On the other hand, when the first vacant cell number "Npv" is 4 (step S14), the neighboring cells neighboring to the target cell C may have the distribution illustrated in FIG. 6A. In this case, the number "Ncv" of the vacant cells $2b$ included in the four second neighboring cells neighboring to the target cell C is calculated (step S15). The number "Ncv" is hereinafter referred to as the second vacant cell number.

When the first vacant cell number "Npv" is 4 and the second vacant cell number "Ncv" is 4 (step S16), the neighboring cells neighboring to the target cell C are all the vacant cells $2b$. Therefore, the filling rate "ΔP" for the target cell C is 0.

On the other hand, when the first vacant cell number "Npv" is 4 and the second vacant cell number "Ncv" is less than 4 (step S16), the neighboring cells neighboring to the target cell C have a distribution of TYPE4 (step S21). Specifically, when the second vacant cell number "Ncv" is 4−K (K is an integral number of 1 to 4), the target cell C has a distribution corresponding to synthesis of K TYPE4s. Therefore, the filling rate "ΔP" for the target cell C in this case is the sum of the contributing rates of K second neighboring cells.

When the first vacant cell number "Npv" is 3 (step S17), the neighboring cells neighboring to the target cell C has a distribution of TYPE1 (step S22). Therefore, the filling rate "ΔP" for the target cell C in this case is represented as "$R_1$" using the reference characters in FIG. 5A.

When the first vacant cell number "Npv" is 2 (step S18), the four first neighboring cells neighboring to the target cell C include two filled cells $2a$.

When these filled cell $2a$ neighbor to each other (step S19), the neighboring cells neighboring to the target cell C have a distribution of TYPE2 (step S23). Therefore, the filling rate "ΔP" for the target cell C in this case is represented as "max [$R_1$, $R_2$]" using the reference characters in FIG. 5B.

On the other hand, when the filled cells $2a$ are opposite to each other (step S19), the neighboring cells neighboring to the target cell C have a distribution corresponding to synthesis of two TYPE1s (step S24). Therefore, the filling rate "ΔP" for the target cell C in this case is represented as "$R_1+R_2$" using the reference characters in FIG. 7A.

When the first vacant cell number "Npv" is 1 (step S18), the neighboring cells neighboring to the target cell C have a distribution of TYPE3 (step S25). Therefore, the filling rate "ΔP" for the target cell C in this case is represented as "max [$R_1$, $R_2+R_3$]" using the reference characters in FIG. 5C.

TYPE1 may be synthesized with one or two TYPE4s (see FIG. 7B). Furthermore, TYPE2 may be synthesized with one TYPE4. Therefore, in the present embodiment, processing similar to the processing in step S21 is executed after steps S22 and S23.

When steps S21 to S25 end, the target cell C is filled (step S31). That is, the filling ratio "ΔP" of the target cell C is changed based on the filling rate "ΔP" for the target cell C.

The processing in steps S11 to S26 is executed on all the cells in the calculating area 1 (all the vacant cells $2b$ when the deposition process is treated) (step S31). Finally, the target cells C for which the filling ratio "P" have reached 1 are changed from the vacant cells $2b$ to the filled cells $2a$ (step S32).

Blocks in which the processing in steps S21 to S25 is executed are an example of a contributing rate calculation module and an example of a filling rate calculation module. For example, for the calculating area 1 in FIG. 7B, the contributing rate "$R_1$" of the cell $C_1$ and the contributing rate "$R_2 \times \pi/4$" of the cell $C_2$ are calculated by the contributing rate calculation module. In this case, the filling rate "ΔP" for the target cell C is calculated to be "$\Delta P = R_1 + R_2 \times \pi/4$" by the filling rate calculation module.

Furthermore, for the calculating area 1 in FIG. 5B, the contributing rates of the cells $C_1$ and $C_2$ are calculated in accordance with the equation with "max [$R_1$, $R_2$]" by the contributing rate calculation module. For example, when "$R_1$" is higher than "$R_2$", the contributing rate "$R_1$" of the cell $C_1$ and the contributing rate 0 of the cell $C_2$ are calculated by the contributing rate calculation module. In this case, the filling rate "ΔP" for the target cell C is determined to be "$\Delta P = R_1$" by the filling rate calculation module.

As described above, when the filling rate "ΔP" for the target cell C of the present embodiment is calculated, the contributing rate of each neighboring cell contributing to the filling rate "ΔP" for the target cell C is calculated based on the deposition rates "R" for the neighboring cells of the target cell C, and the filling rate "ΔP" for the target cell C is calculated based on the contributing rates of the neighboring cells. Furthermore, the contributing rate of each neighboring cell of the target cell C of the present embodiment is set depending on whether another neighboring cell of the target cell C is the filled cell $2a$ (first cell) or the vacant cell $2b$ (second cell).

Therefore, according to the present embodiment, even when the substance has the topography such as a convex portion or a concave portion which reduces the calculation accuracy, the changes in topography of the substance can be appropriately calculated. For example, the present embodiment enables underestimation of changes in the convex portion and overestimation of changes in the concave portion to be corrected.

Second Embodiment

Figure 10A:
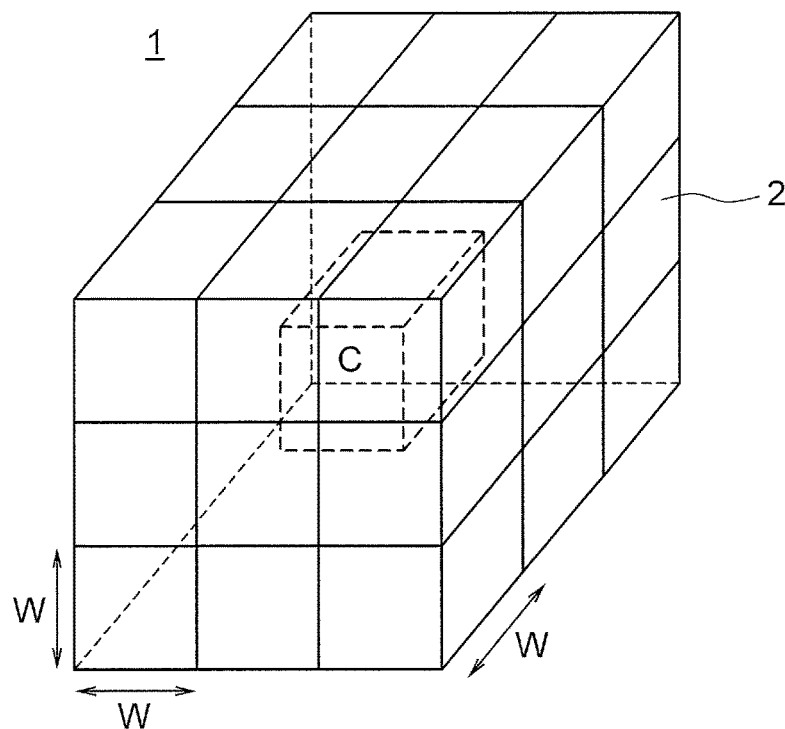
FIGS. 10A and 10B are diagrams illustrating a calculating area for a topography simulation method of a second embodiment.
Figure 10B:
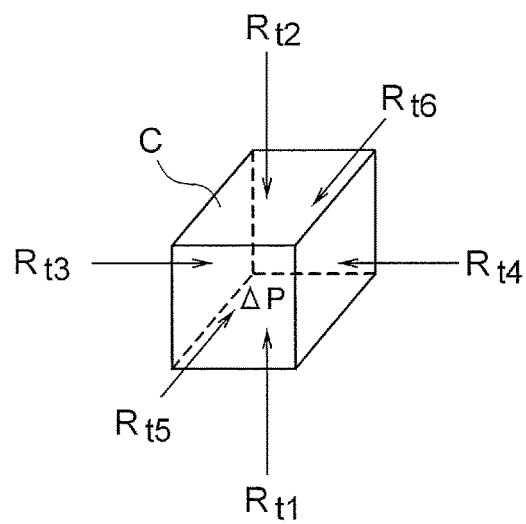

FIGS. 10A and 10B are diagrams illustrating a calculating area for a topography simulation method of a second embodiment.

FIG. 10A illustrates the calculating area 1 with a plurality of the cells 2. The calculating area 1 of the present embodiment is a three-dimensional area. Each of the cells 2 of the present embodiment is shaped like a cube. A side of each cell 2 is denoted by reference character W. The shape of each cell 2 may be other than the cubic.

FIG. 10A illustrates 27 (3×3×3) cells 2. The cells correspond to some of the cells 2 in the calculating area 1. The number of the cells 2 in the calculating area 1 can be optionally set with the calculation accuracy and time for topography simulation taken into account.

As is the case with the first embodiment, the topography simulation method of the present embodiment is executed in accordance with the cell method. The topography simulation method of the present embodiment allows simulation of various types of processing of the substance such as deposition and etching. A case will be described below where the topography simulation method of the present embodiment is applied to the deposition process.

As is the case with the first embodiment, the cells 2 of the present embodiment include the filled cells 2a and the vacant cells 2b. Each of the filled cells 2a has the deposition rate "R" as a variable. Each of the vacant cells 2b has the filling ratio "P" as a variable.

FIG. 10A illustrates one target cell C and 26 neighboring cells neighboring to the target cell C. The filling rate "ΔP" for the target cell C of the present embodiment depends on the deposition rates "R" for the neighboring cells. Therefore, the filling rate "ΔP" for the target cell C of the present embodiment is calculated based on the deposition rates "R" for the neighboring cells.

The neighboring cells neighboring to the target cell C include six first neighboring cells sharing a surface with the target cell C, 12 second neighboring cells sharing a side with the target cell C, and eight third neighboring cells sharing a corner with the target cell C. Each of the first neighboring cells neighbors to the target cell C at the first distance "W" from the target cell C. Each of the second neighboring cells neighbors to the target cell C at the second distance $2^{1/2}\times$ "W" from the target cell C. Each of the third neighboring cells neighbors to the target cell C at a third distance $3^{1/2}\times$"W" from the target cell C. In this case, the square root of 3 is denoted by $3^{1/2}$. The first to third distances each indicate the distance between the centers of the cells 2.

Furthermore, when the filling rate "ΔP" for the target cell C of the present embodiment is calculated, the contributing rate of each of the neighboring cells neighboring to the target cell C which contribute to the filling rate "ΔP" for the target cell C is calculated based on the deposition rates "R" for the neighboring cells neighboring to the target cell C. Then, the filling rate "ΔP" for the target cell C is calculated based on the contributing rates of the neighboring cells. The contributing rate of each of the neighboring cells neighboring to the target cell C of the present embodiment depends on whether the other neighboring cells neighboring to the target cell C are the filled cells 2a or the vacant cells 2b.

The contributing rate of the first neighboring cell is hereinafter appropriately referred to as the "first contributing rate". The contributing rate of the second neighboring cell is hereinafter appropriately referred to as the "second contributing rate". The contributing rate of the third neighboring cell is hereinafter appropriately referred to as the "third contributing rate". The filling rate "ΔP" for the target cell C of the present embodiment is calculated based on the first, second, and third contributing rates.

FIG. 10B illustrates a method for calculating the filling rate "ΔP" for the target cell C of the present embodiment. The filling rate "ΔP" for the target cell C is given by Equation (9).

$$\Delta P = \max[R_{t1}+R_{t2}, R_{t3}R_{t4}, R_{t5}+R_{t6}] \quad (9)$$

An effective deposition rate for the first neighboring cell neighboring to a lower surface of the target cell C is denoted by reference character $R_{t1}$. The effective deposition rate "$R_{t1}$" is not the deposition rate "R" itself for the first neighboring cell but is an effective deposition rate obtained taking into account the deposition rate "R" for the first neighboring cell and the deposition rates "R" for a total of eight second and third neighboring cells surrounding the first neighboring cell. Similarly, the effective deposition rate for the first neighboring cell neighboring to the upper surface of the target cell C is denoted by reference character "$R_{t2}$". The other effective deposition rates "$R_{t3}$" to "$R_{t6}$" are similarly defined.

Equation (9) is defined by rules similar to TYPE1 to TYPE4 of the first embodiment. For example, the relation between the effective deposition rate "$R_{t1}$" and the effective deposition rate "$R_{t2}$" corresponds to synthesis of two TYPE1s in FIG. 7A. Furthermore, the relations between the effective deposition rate "$R_{t1}$" and each of the effective deposition rates "$R_{t3}$" to "$R_{t6}$." correspond to TYPE2 in FIG. 5B and TYPE3 in FIG. 5C.

For example, when "$R_{t1}+R_{t2}$" is larger than "$R_{t3}+R_{t4}$" or "$R_{t5}+R_{t6}$", "$R_{t1}+R_{t2}$" contributes to the filling rate "ΔP" and 100% of the "$R_{t1}+R_{t2}$" serves as a contributing rate. On the other hand, "$R_{t3}+R_{t4}$" does not contribute to the filling rate "ΔP" and 0% of the "$R_{t3}$ and $R_{t4}$" serves as a contributing rate. Similarly, "$R_{t5}+R_{t6}$" does not contribute to the filling rate "ΔP" and 0% of the "$R_{t5}$ and $R_{t6}$" serves as a contributing rate.

With reference to FIGS. 11A to 14B, a method for calculating the effective deposition rate "$R_{t1}$" will be described. The following description also applies to the other effective deposition rates "$R_{t2}$" to "$R_{t6}$".

(1) Procedure for Topography Simulation Method of Second Embodiment

FIGS. 11A to 14B are diagrams illustrating a procedure for the topography simulation method of the second embodiment. This procedure corresponds to the processing in step S4 in FIG. 8.

Figure 11A:
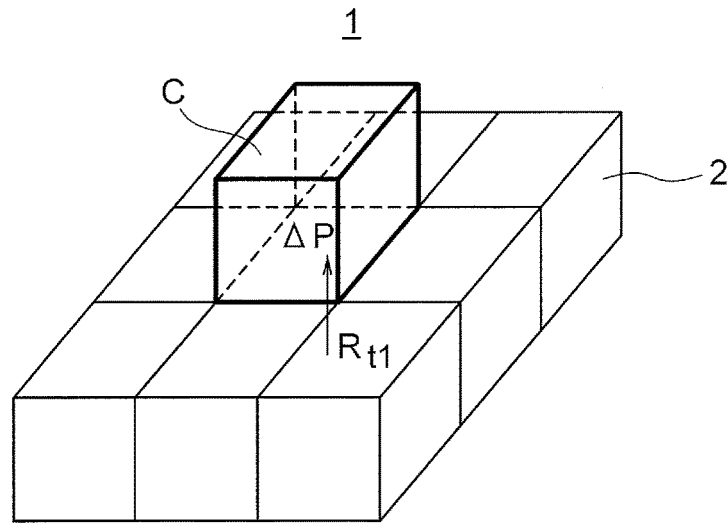
FIGS. 11A to 14B are diagrams illustrating a procedure for the topography simulation method of the second embodiment.

FIG. 11A illustrates the above-described target cell C and nine neighboring cells positioned below the target cell C. The effective deposition rate "$R_{t1}$" depends on the deposition rates "R" for the neighboring cells.

Figure 11B:
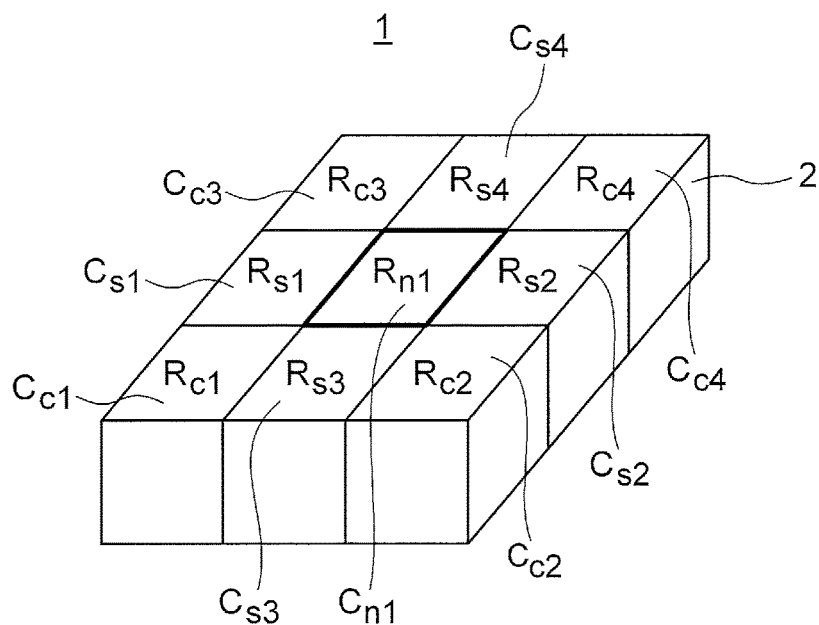

FIG. 11B illustrates the nine neighboring cells. FIG. 11B illustrates a cell $C_{n1}$ that is the first neighboring cell, cells $C_{s1}$ to $C_{s4}$ that are the second neighboring cells, and cells $C_{c1}$ to $C_{c4}$ that are the third neighboring cells. FIG. 11B further illustrates a deposition rate "$R_{n1}$" for the cell $C_{n1}$, deposition rates "$R_{s1}$" to "$R_{s4}$" for the cells $C_{s1}$ to $C_{s4}$, and deposition rates "$R_{c1}$" to "$R_{c4}$" for the cells $C_{c1}$ to $C_{c4}$.

In the topography simulation method of the second embodiment, whether the cell $C_{n1}$ is the filled cell 2a or the vacant cell 2b is determined (FIG. 11B). When the cell $C_{n1}$ is the filled cell 2a, the effective deposition rate "$R_{t1}$" is calculated in accordance with Equation (10).

$$R_{t1}=R_{n1} \quad (10)$$

When the cell $C_{n1}$ is the filled cell 2a, the effective deposition rate "$R_{t1}$" is determined only by the deposition rate "$R_{n1}$" for the cell C. On the other hand, when the cell $C_{n1}$ is the vacant cell 2b, the effective deposition rate "$R_{t1}$" is calculated taking into account the deposition rates "$R_{s1}$" to "$R_{s4}$" and "$R_{c1}$" to "$R_{c4}$" as follows.

Figure 12A:
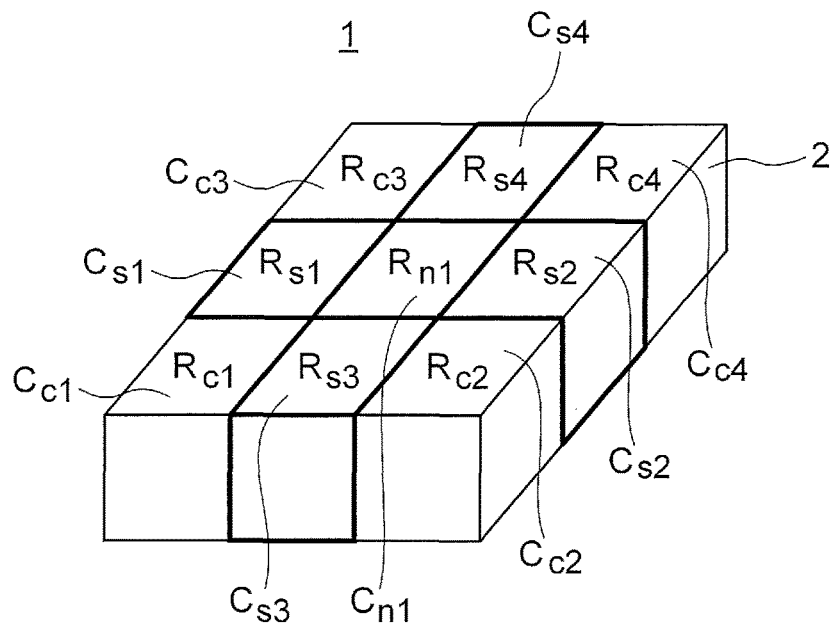
Figure 12B:
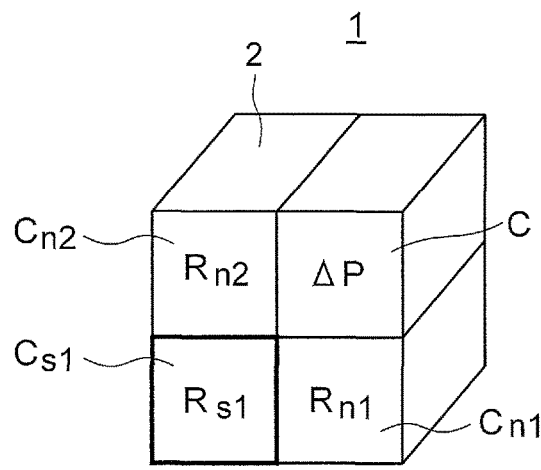

First, the deposition rates "$R_{s1}$" to "$R_{s4}$" will be described (FIG. 12A). FIG. 12B illustrates the target cell C, the cell $C_{s1}$, and the cells $C_{n1}$ and $C_{n2}$ sharing a surface with the cells C and $C_{s1}$. The deposition rate "R" for the cell $C_{n2}$ is denoted by reference character "$R_{n2}$". FIG. 12B illustrates a method for calculating an effective deposition rate "$R_{s1}$'" for the cell $C_{s1}$. When the cells C, $C_{n1}$, and $C_{n2}$ are all the vacant cells 2b, the effective deposition rate "$R_{s1}$'" is calculated in accordance with Equation (11).

$$R_{s1}'=R_{s1}\times\pi/4 \quad (11)$$

The coefficient π/4 corresponds to a quarter of the area of a circle with a radius of 1. An approximate value for π/4 is 0.785. The coefficient π/4 is an example of a first positive constant smaller than 1. On the other hand, when at least one of the cells C, $C_{n1}$, and $C_{n2}$ is the filled cell 2a, the effective deposition rate "$R_{s1}'''$" is 0 ("$R_{s1}'''$"=0). Similarly, the effective deposition rates "$R_{s2}'''$" to "$R_{s4}'''$" are defined.

Figure 13A:
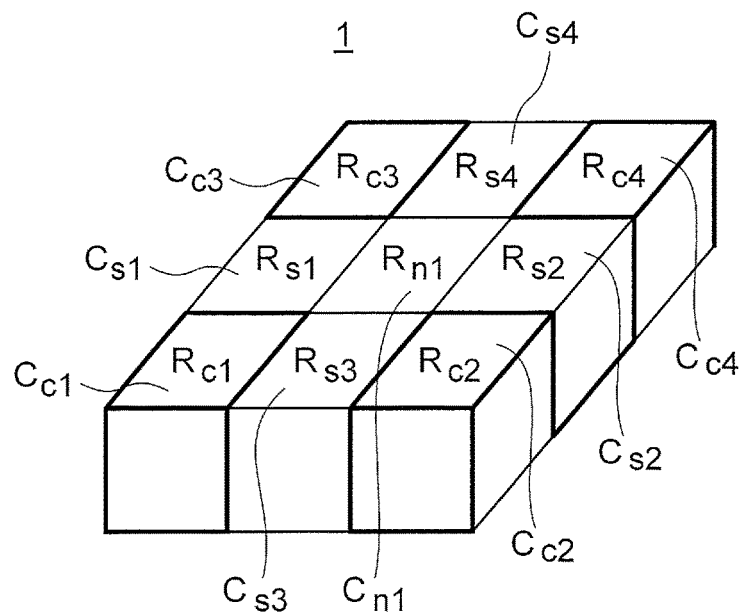
Figure 13B:
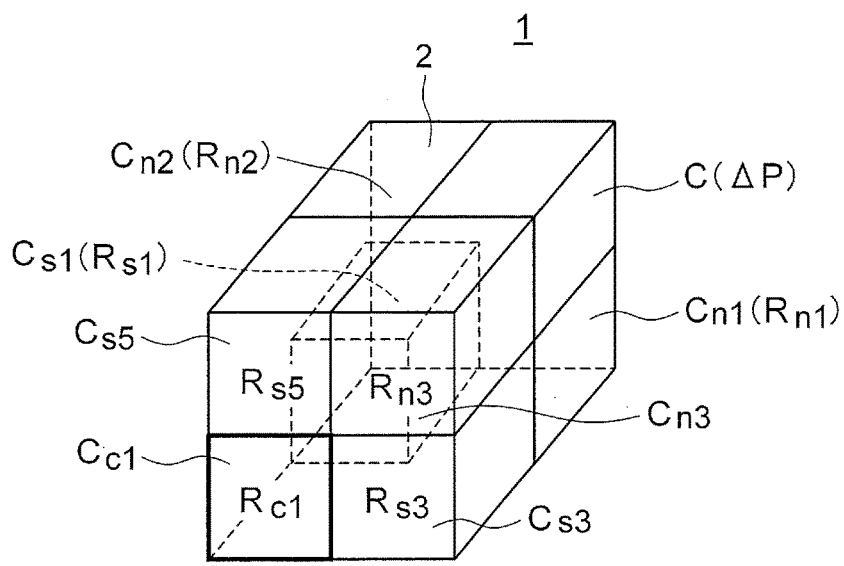

Now, the deposition rates "$R_{c1}$" to "$R_{c4}$" will be described (FIG. 13A). FIG. 13B illustrates the target cell C, the cell $C_{c1}$, and the cells $C_{n1}$, $C_{n2}$, $C_{n3}$, $C_{s1}$, $C_{s3}$, and $C_{s5}$ sharing a surface or a side with the cells C and $C_{c1}$. The deposition rates "R" for the cells $C_{n3}$ and $C_{s5}$ is denoted by reference characters "$R_{n3}$" and "$R_{s5}$". FIG. 13B illustrates a method for calculating an effective deposition rate "$R_{c1}'''$" for the cell $C_{c1}$. When the cells C, $C_{n1}$, $C_{n2}$, $C_{n3}$, $C_{s1}$, $C_{s3}$, and $C_{s5}$ are all the vacant cells 2b, the effective deposition rate "$R_{c1}'''$" is calculated in accordance with Equation (12).

$$R_{c1}' = R_{c1} \times \pi/6 \quad (12)$$

The coefficient π/6 corresponds to one-eighth of the volume of a sphere with a radius of 1. An approximate value for π/6 is 0.524. The coefficient π/6 is an example of a second positive constant smaller than the first constant. On the other hand, when at least one of the cells C, $C_{n1}$, $C_{n2}$, $C_{n3}$, $C_{s1}$, $C_{s3}$, and $C_{s5}$ is the filled cell 2a, the effective deposition rate "$R_{c1}'''$" is 0 ("$R_{c1}'''$"=0). Similarly, the effective deposition rates "$R_{c2}'''$" to "$R_{c4}'''$" are defined.

Figure 14A:
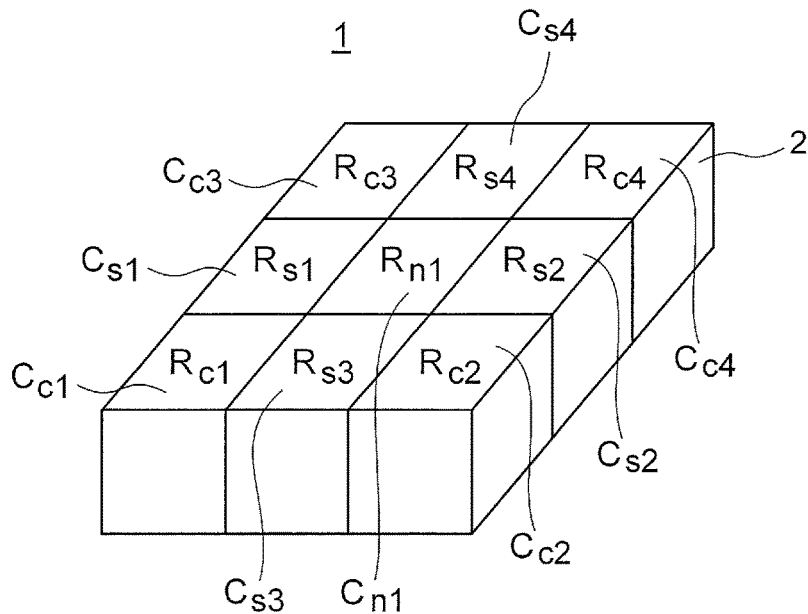

Then, the effective deposition rate "$R_{t1}$" obtained when the cell $C_{n1}$ is the vacant cell 2b is calculated in accordance with Equation (13), as illustrated in FIG. 14A.

$$R_{t1} = \max[(R_{s1}' + R_{s2}'),(R_{s3}' + R_{s4}')] + (R_{c1}' + R_{c1}' + R_{c1}' + R_{c1}') \quad (13)$$

Figure 14B:
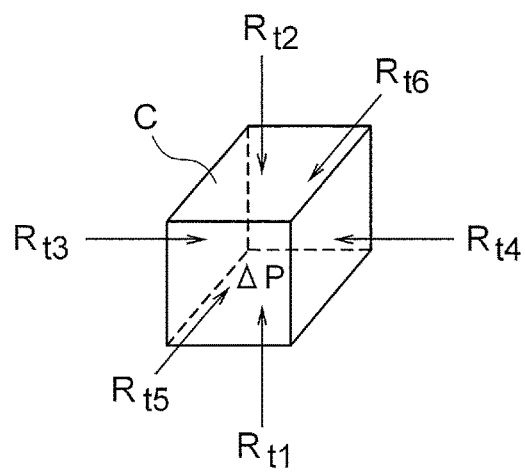

Then, the effective deposition rates "$R_{t1}$" to "$R_{t6}$" are substituted into Equation (9). As a result, the filling rate "ΔP" for the target cell C is calculated as illustrated in FIG. 14B.

For example, when the cell $C_{s1}$ is the filled cell 2a and the other 25 neighboring cells are the vacant cells 2b, the filling rate "ΔP" for the target cell C is given by Equation (14).

$$\Delta P = R_{t1} = R_{s1}' = R_{s1} \times \pi/4 \quad (14)$$

This means that the contributing rate of the cell $C_{s1}$ (second neighboring cell) is 78.5% of the deposition rate "$R_{s1}$". The first constant π/4 in the present embodiment may be substituted with another positive value smaller than 1.

Furthermore, when the cell $C_{c1}$ is the filled cell 2a and the other 25 neighboring cells are the vacant cells 2b, the filling rate "ΔP" for the target cell C is given by Equation (15).

$$\Delta P = R_{t1} = R_{c1}' = R_{c1} \times \pi/6 \quad (15)$$

This means that the contributing rate of the cell $C_{c1}$ (third neighboring cell) is 52.4% of the deposition rate "$R_{c1}$". The second constant π/6 in the present embodiment may be substituted with another positive value smaller than the first constant.

As described above, the contributing rate of each of the neighboring cells neighboring to the target cell C of the present embodiment depends on whether the other neighboring cells neighboring to the target cell C are the filled cells 2a or the vacant cells 2b.

Specifically, the contributing rate of each of the first neighboring cells depends on whether the other neighboring cells neighboring to the target cell C are the filled cells 2a or the vacant cells 2b. For example, the contributing rate of the cell $C_{n1}$ (first neighboring cell) depends on whether the cells $C_{n2}$ to $C_{n6}$ are the filled cells 2a or the vacant cells 2b, as is understood from Equation (9).

Furthermore, the contributing rate of each of the second neighboring cells depends on whether the first neighboring cells neighboring to each of the second neighboring cells are the filled cells 2a or the vacant cells 2b. For example, the contributing rate of the cell $C_{s1}$ (second neighboring cell) depends on whether the cells $C_{n1}$ and $C_{n2}$ are the filled cells 2a or the vacant cells 2b, as understood from FIG. 12B. The contributing rate of the cell $C_{s1}$ also depends on whether $C_{s3}$ and $C_{s4}$, the other second neighboring cells, are the filled cells 2a or the vacant cells 2b as is understood from Equation (13).

Additionally, the contributing rate of each of the third neighboring cells depends on whether the first and second neighboring cells neighboring to each of the third neighboring cells are the filled cells 2a or the vacant cells 2b. For example, the contributing rate of the cell $C_{c1}$ (third neighboring cell) depends on whether the cells $C_{n1}$, $C_{n2}$, $C_{n3}$, $C_{s1}$, $C_{s3}$, and $C_{s5}$ are the filled cells 2a or the vacant cells 2b, as is understood from FIG. 13B.

For simplified description, Equation (9) and Equation (13) include the deposition rate "R" for the vacant cell 2b for which the deposition rate "R" is otherwise not set. In Equation (9) and Equation (13), the deposition rate "R" for the vacant cell 2b is assumed to be 0.

FIGS. 15A to 15D are plan views illustrating a first advantage of the topography simulation method of the second embodiment.

Figure 15A:
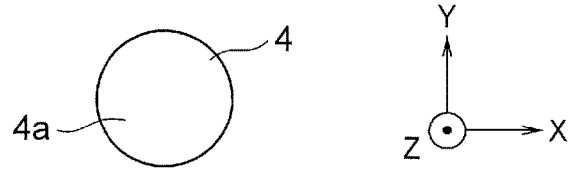
FIGS. 15A to 15D are plan views illustrating a first advantage of the topography simulation method of the second embodiment.
Figure 15B:
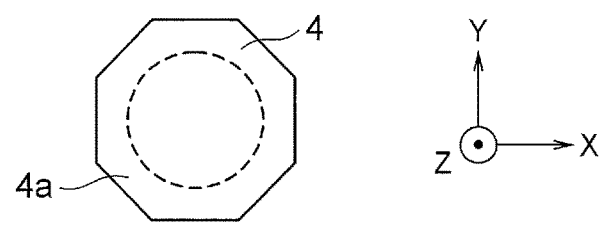
Figure 15C:
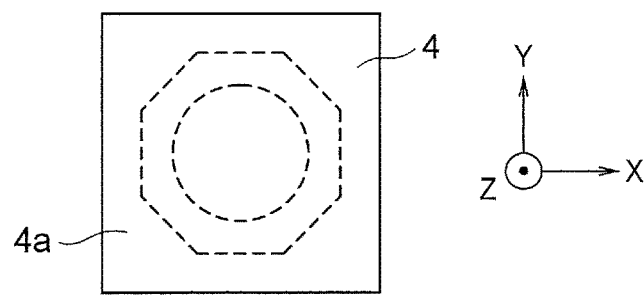
Figure 15D:
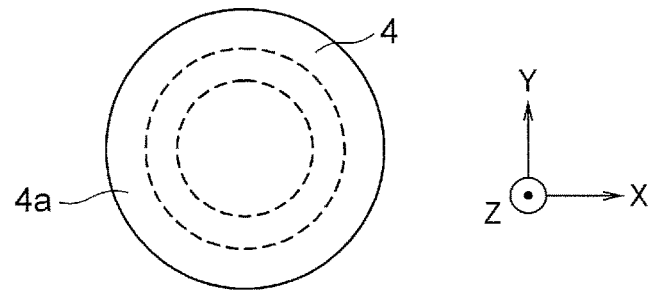

FIG. 15A illustrates the planar shape of the deposited film 4 corresponding to the calculating area 1. The deposited film 4 has a cylindrical convex portion 4a. In the actual semiconductor fabrication steps, the shape of the convex portion 4a in FIG. 15A changes while maintaining the cylindrical shape as illustrated in FIG. 15D. However, in the topography simulation method in the comparative example, the calculation accuracy for changes in the convex portion 4a is poor, causing the cylindrical shape to change into a polygon (FIG. 15B and FIG. 15C).

On the other hand, for example, to calculate the filling rate "ΔP" for the target cell C, not only the deposition rates "R" for the first neighboring cells but also the deposition rates "R" for the second and third neighboring cells are used according to the present embodiment. Furthermore, in the present embodiment, the first coefficient π/4 is used to calculate the contributing rate of the second neighboring cell, and the second coefficient π/6 is used to calculate the contributing rate of the third neighboring cell. Therefore, the present embodiment enables improvement of the calculation accuracy for changes in the convex portion 4a and calculation of topography changes in the convex portion 4a which are similar to the topography changes in FIG. 15D.

FIGS. 16A to 16D are plan views illustrating a second advantage of the topography simulation method of the second embodiment.

Figure 16A:
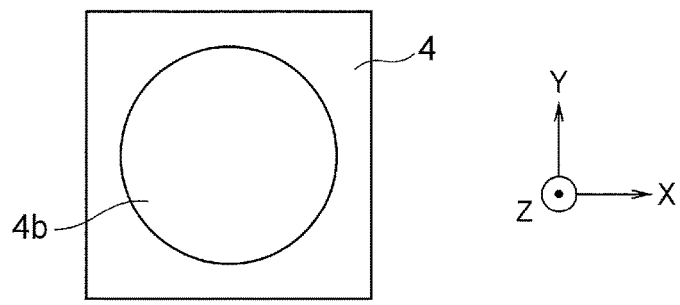
FIGS. 16A to 16D are plan views illustrating a second advantage of the topography simulation method of the second embodiment.
Figure 16B:
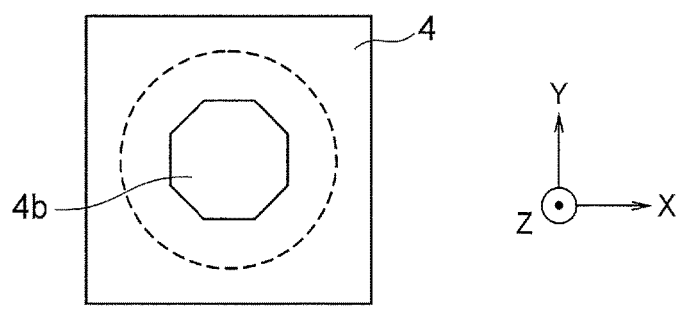
Figure 16C:
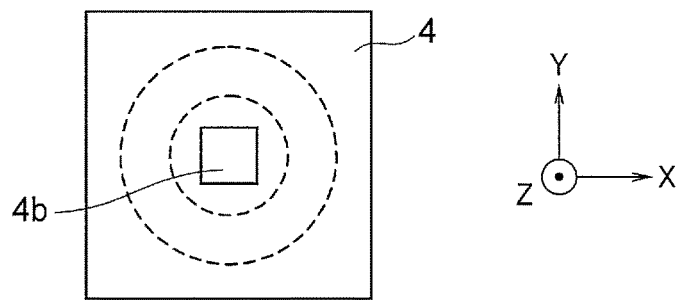
Figure 16D:
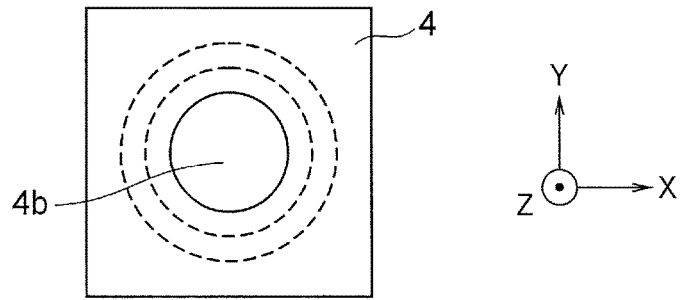

FIG. 16A illustrates the planar shape of the deposited film 4 corresponding to the calculating area 1. The deposited film 4 has a cylindrical concave portion 4b. In the actual semiconductor fabrication steps, the shape of the concave portion 4b in FIG. 16A changes while maintaining the cylindrical shape as illustrated in FIG. 16D. However, in the topography simulation method in the comparative example, the calculation accuracy for changes in the concave portion 4b is poor, causing the cylindrical shape to change into a polygon (FIG. 16B and FIG. 16C).

On the other hand, for example, to calculate the filling rate "ΔP" for the target cell C, not only the deposition rates "R" for the first neighboring cells but also the deposition rates "R" for the second and third neighboring cells are used according to the present embodiment. Furthermore, according to the present embodiment, when the total contributing rate of a plurality of cells 2 is calculated, not only are the deposition rates "R" for these cells 2 simply added together but also the deposition rates "R" for the cells 2 expected not to contribute to the filling rate "ΔP" are excluded (see Equation (9) and Equation (13)). Therefore, the present embodiment enables improvement of the calculation accuracy for changes in the concave portion 4b and calculation of topography changes in the concave portion 4b which are similar to the topography changes in FIG. 16D.

As described above, when the filling rate "ΔP" for the target cell C of the present embodiment is calculated, the contributing rate of each neighboring cell of the target cell C contributing to the filling rate "ΔP" for the target cell C is calculated based on the deposition rates "R" for the neighboring cells of the target cell C, and the filling rate "ΔP" for the target cell C is calculated based on the contributing rates of the neighboring cells, as similar to the first embodiment. Furthermore, the contributing rate of each neighboring cell of the target cell C of the present embodiment is set depending on whether another neighboring cell of the target cell C is the filled cell 2a (first cell) or the vacant cell 2b (second cell).

Therefore, according to the present embodiment, even when the substance has the topography such as a convex portion or a concave portion which reduces the calculation accuracy, the changes in topography of the substance can be appropriately calculated.

Third Embodiment

Figure 17:
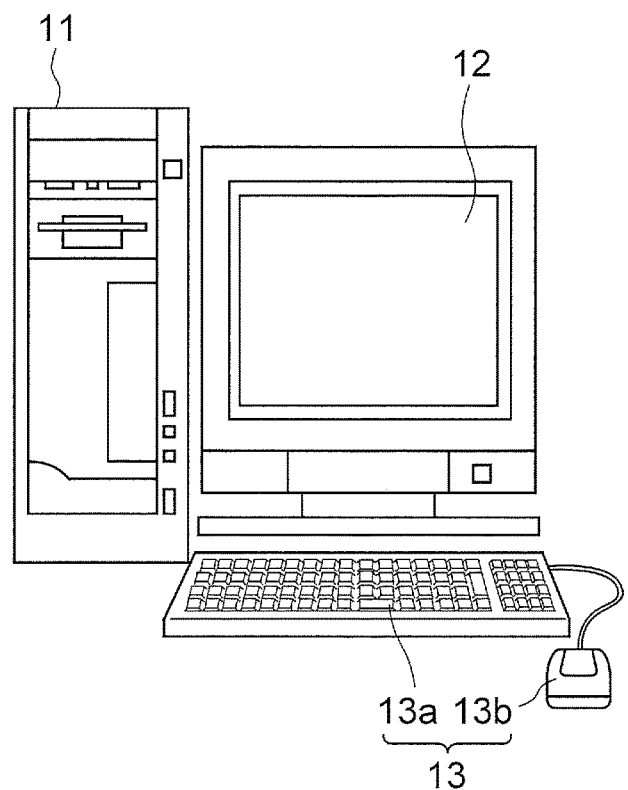
FIG. 17 is a diagram illustrating an appearance of a topography simulation apparatus of a third embodiment.

FIG. 17 is a diagram illustrating an appearance of a topography simulation apparatus of a third embodiment.

The topography simulation apparatus in FIG. 17 includes a controller 11, a display module 12, and an input module 13.

The controller 11 is a module that controls operations of the topography simulation apparatus. The controller 11, for example, executes the topography simulation method of the first or second embodiment. The details of the controller 11 will be described below.

The display module 12 has a display device such as a liquid crystal monitor. The display module 12 displays, for example, input screens for setting information for topography simulation and the results of calculations for topography simulation.

The input module 13 has input devices such as a keyboard 13a and a mouse 13b. The input module 13 is used to input the setting information for topography simulation. Examples of the setting information include information on calculation formulae, information on experimental values and predicted values, information on the topography of the substance, information on fluxes, and information on conditions and procedures for topography simulation.

Figure 18:
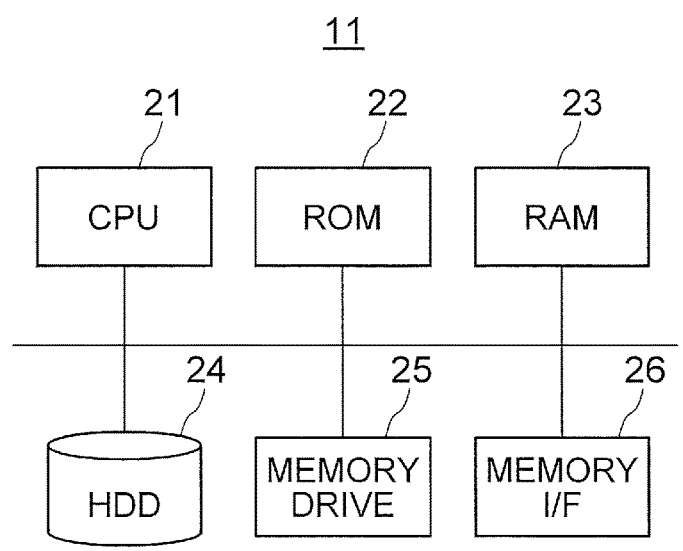
FIG. 18 is a block diagram illustrating a configuration of a controller in FIG. 17.

FIG. 18 is a block diagram illustrating a configuration of the controller 11 in FIG. 17.

The controller 11 includes a central processing unit (CPU) 21, a read only memory (ROM) 22, a random access memory (RAM) 23, a hard disk drive (HDD) 24, and a memory drive 25 such as a compact disc (CD) drive and a digital versatile disk (DVD) drive, and a memory interface (I/F) 26 such as a memory port and a memory slot.

In the present embodiment, a topography simulation program that is a program for the topography simulation method of the first or second embodiment is stored in the ROM 22 or the HDD 24. Upon receiving predetermined instructive information from the input module 13, the CPU 21 reads the topography simulation program from the ROM 22 or the HDD 24, decompresses the read program into the RAM 23, and executes topography simulation in accordance with the program. Various data resulting from this processing are held in the RAM 23.

In the present embodiment, a computer-readable recoding medium having the topography simulation program stored in a non-transitory manner may be provided, and the topography simulation program may be installed from the recording medium into the ROM 22 or the HDD 24. Examples of such a recording medium include a CD-ROM and a DVD-ROM.

Furthermore, in the present embodiment, the topography simulation program may be installed into the ROM 22 or the HDD 24 by being downloaded via a network such as the Internet.

As described above, the present embodiment can provide a topography simulation apparatus and a topography simulation program which allow execution of the topography simulation method of the first or second embodiment.

While certain embodiments have been described, these embodiments have been presented by way of example only, and are not intended to limit the scope of the inventions. Indeed, the novel apparatuses, methods and media described herein may be embodied in a variety of other forms; furthermore, various omissions, substitutions and changes in the form of the apparatuses, methods and media described herein may be made without departing from the spirit of the inventions. The accompanying claims and their equivalents are intended to cover such forms or modifications as would fall within the scope and spirit of the inventions.

The invention claimed is:

1. A topography simulation apparatus comprising:
a hardware processor which is configured to function as:
  a division module configured to divide a calculating area for calculating topography of a substance into a plurality of cells, wherein the topography of the substance includes at least one of a convex portion and a concave portion, and to express the topography of the substance using filled cells which are filled with a predetermined amount of the substance and vacant cells which are not filled with the predetermined amount of the substance;
  a calculation module configured to calculate a filling rate for a target cell in the calculating area, based on processing rates for neighboring cells which neighbor the target cell, wherein the target cells include at least one of the concave portion and the convex portion of the topography of the substance; and
  an outputting module configured to perform a time evolution calculation of changing a distribution of the filled cells and the vacant cells based on the filling rate to calculate a change in the topography of the substance, and to output a calculation result of the change in the topography of the substance to a display device,
the calculation module comprising:
  a contributing rate calculation module configured to calculate, based on the processing rates for the neighboring cells, contributing rates of the neighboring cells contributing to the filling rate for the target cell; and
  a filling rate calculation module configured to calculate, based on the contributing rates of the neighboring cells, the filling rate for the target cell,
  wherein one of the contributing rates of the neighboring cells of the target cell depends on whether another neighboring cell of the target cell is a first cell whose filling ratio of the substance belongs to a first range or a second cell whose filling ratio of the substance belongs to a second range different from the first range, wherein the calculation module corrects changes for at least one of an underestimation of changes in the convex portion and an overestimation of changes in the concave portion the topography of the substrate.

2. The apparatus of claim 1, wherein the contributing rate calculation module comprises:
a first rate calculation module configured to calculate first contributing rates of first neighboring cells, regarding the first neighboring cells which neighbor the target cell at a first distance; and
a second rate calculation module configured to calculate second contributing rates of second neighboring cells, regarding the second neighboring cells which neighbor the target cell at a second distance longer than the first distance,
wherein the filling rate calculation module calculates the filling rate for the target cell, based on the first and second contributing rates.

3. The apparatus of claim 2, wherein a first contributing rate of one of the first neighboring cells depends on whether another first neighboring cell of the target cell is the first cell or the second cell.

4. The apparatus of claim 2, wherein a second contributing rate of one of the second neighboring cells depends on whether a first neighboring cell which neighbors the one second neighboring cell is the first cell or the second cell.

5. The apparatus of claim 2, wherein when one of the first neighboring cells is the first cell, a first contributing rate of the one first neighboring cell becomes a processing rate for the one first neighboring cell.

6. The apparatus of claim 2, wherein when two of the first neighboring cells are first cells and neighbor to each other, a total contributing rate of the two first neighboring cells becomes a processing rate for one of the two first neighboring cells with a higher processing rate.

7. The apparatus of claim 2, wherein when two of the first neighboring cells are first cells and are opposite to each other, a total contributing rate of the two first neighboring cells becomes a sum of processing rates for the two first neighboring cells.

8. The apparatus of claim 2, wherein the second contributing rates of the second neighboring cells are calculated by multiplying the processing rates for the second neighboring cells by a positive constant smaller than one.

9. The apparatus of claim 2, wherein the contributing rate calculation module further comprises:
a third rate calculation module configured to calculate third contributing rates of third neighboring cells, regarding the third neighboring cells which neighbor the target cell at a third distance longer than the second distance,
wherein the filling rate calculation module calculates the filling rate for the target cell, based on the first, second and third contributing rates.

10. The apparatus of claim 9, wherein a third contributing rate of one of the third neighboring cells depends on whether first and second neighboring cells which neighbor the one third neighboring cell are first cells or second cells.

11. The apparatus of claim 9, wherein:
the second contributing rates of the second neighboring cells are calculated by multiplying the processing rates for the second neighboring cells by a first positive constant smaller than one, and
the third contributing rates of the third neighboring cells are calculated by multiplying the processing rates for the third neighboring cells by a second positive constant smaller than the first positive constant.

12. A topography simulation method performed by a hardware processor, comprising:
dividing a calculating area for calculating topography of a substance into a plurality of cells, wherein the topography of the substance includes at least one of a convex portion and a concave portion, and expressing the topography of the substance using filled cells which are filled with a predetermined amount of the substance and vacant cells which are not filled with the predetermined amount of the substance;
calculating a filling rate for a target cell in the calculating area, based on processing rates for neighboring cells which neighbor the target cell, wherein the target cells include at least one of the concave portion and the convex portion of the topography of the substance; and
performing a time evolution calculation of changing a distribution of the filled cells and the vacant cells based on the filling rate to calculate a change in the topography of the substance, and outputting a calculation result of the change in the topography of the substance to a display device,
the calculating the filling rate for the target cell comprising:
calculating, based on the processing rates for the neighboring cells, contributing rates of the neighboring cells contributing to the filling rate for the target cell; and
calculating, based on the contributing rates of the neighboring cells, the filling rate for the target cell,
wherein one of the contributing rates of the neighboring cells of the target cell depends on whether another neighboring cell of the target cell is a first cell whose filling ratio of the substance belongs to a first range or a second cell whose filling ratio of the substance belongs to a second range different from the first range, and
correcting changes for at least one of an underestimation of changes in the convex portion and an overestimation of changes in the concave portion the topography of the substrate.

13. The method of claim 12, further comprising:
calculating first contributing rates of first neighboring cells, regarding the first neighboring cells which neighbor the target cell at a first distance; and
calculating second contributing rates of second neighboring cells, regarding the second neighboring cells which neighbor the target cell at a second distance longer than the first distance;
wherein the filling rate for the target cell is calculated based on the first and second contributing rates.

14. The method of claim 13, wherein a first contributing rate of one of the first neighboring cells depends on whether another first neighboring cell of the target cell is the first cell or the second cell.

15. The method of claim 13, wherein a second contributing rate of one of the second neighboring cells depends on whether a first neighboring cell which neighbors the one second neighboring cell is the first cell or the second cell.

16. The method of claim 13, wherein the second contributing rates of the second neighboring cells are calculated by multiplying the processing rates for the second neighboring cells by a positive constant smaller than one.

17. The method of claim 13, further comprising:
calculating third contributing rates of third neighboring cells, regarding the third neighboring cells which neighbor the target cell at a third distance longer than the second distance;

wherein the filling rate for the target cell is calculated based on the first, second and third contributing rates.

18. The method of claim 17, wherein a third contributing rate of one of the third neighboring cells depends on whether first and second neighboring cells which neighbor the one third neighboring cell are first cells or second cells.

19. The method of claim 17, wherein:
the second contributing rates of the second neighboring cells are calculated by multiplying the processing rates for the second neighboring cells by a first positive constant smaller than one, and
the third contributing rates of the third neighboring cells are calculated by multiplying the processing rates for the third neighboring cells by a second positive constant smaller than the first positive constant.

20. A non-transitory computer-readable recording medium containing a topography simulation program which causes a hardware processor to perform operations comprising:
dividing a calculating area for calculating topography of a substance into a plurality of cells, wherein the topography of the substance includes at least one of a convex portion and a concave portion, and expressing the topography of the substance using filled cells which are filled with a predetermined amount of the substance and vacant cells which are not filled with the predetermined amount of the substance;
calculating a filling rate for a target cell in the calculating area, based on processing rates for neighboring cells which neighbor the target cell, wherein the target cells include at least one of the concave portion and the convex portion of the topography of the substance; and
performing a time evolution calculation of changing a distribution of the filled cells and the vacant cells based on the filling rate to calculate a change in the topography of the substance, and outputting a calculation result of the change in the topography of the substance to a display device,
the calculating the filling rate for the target cell comprising:
calculating, based on the processing rates for the neighboring cells, contributing rates of the neighboring cells contributing to the filling rate for the target cell; and
calculating, based on the contributing rates of the neighboring cells, the filling rate for the target cell,
wherein one of the contributing rates of the neighboring cells of the target cell depends on whether another neighboring cell of the target cell is a first cell whose filling ratio of the substance belongs to a first range or a second cell whose filling ratio of the substance belongs to a second range different from the first range, and
correcting changes for at least one of an underestimation of changes in the convex portion and an overestimation of changes in the concave portion the topography of the substrate.

* * * * *